(12) United States Patent
Kim et al.

(10) Patent No.: US 11,380,607 B2
(45) Date of Patent: Jul. 5, 2022

(54) SEMICONDUCTOR DEVICE

(71) Applicant: Samsung Electronics Co., Ltd., Suwon-si (KR)

(72) Inventors: Jinnam Kim, Anyang-si (KR); Seokho Kim, Hwaseong-si (KR); Hoonjoo Na, Seoul (KR); Kwangjin Moon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/147,927

(22) Filed: Jan. 13, 2021

(65) Prior Publication Data

US 2021/0375722 A1 Dec. 2, 2021

(30) Foreign Application Priority Data

May 29, 2020 (KR) .................. 10-2020-0065110

(51) Int. Cl.
*H01L 23/48* (2006.01)
*H01L 29/06* (2006.01)
*H01L 29/78* (2006.01)
*H01L 29/66* (2006.01)

(52) U.S. Cl.
CPC ........ *H01L 23/481* (2013.01); *H01L 29/0649* (2013.01); *H01L 29/0665* (2013.01); *H01L 29/66795* (2013.01); *H01L 29/785* (2013.01)

(58) Field of Classification Search
CPC . H01L 29/785; H01L 29/0649; H01L 23/481; H01L 29/0665; H01L 29/0653; H01L 29/42392
See application file for complete search history.

(56) References Cited

U.S. PATENT DOCUMENTS

| | | | |
|---|---|---|---|
| 8,034,704 B2 | 10/2011 | Komai et al. | |
| 8,853,857 B2 | 10/2014 | Farooq et al. | |
| 9,245,800 B2 | 1/2016 | Matsuura | |
| 9,646,930 B2 | 5/2017 | Tezcan et al. | |
| 9,806,004 B2 | 10/2017 | Lee et al. | |
| 9,997,443 B2 | 6/2018 | Brech et al. | |
| 2018/0145030 A1 | 5/2018 | Beyne et al. | |
| 2018/0151494 A1 | 5/2018 | Ohtou et al. | |
| 2021/0343578 A1* | 11/2021 | Chang | H01L 29/41733 |
| 2021/0343639 A1* | 11/2021 | Wang | H01L 21/823475 |

* cited by examiner

*Primary Examiner* — Changhyun Yi
(74) *Attorney, Agent, or Firm* — Muir Patent Law, PLLC

(57) ABSTRACT

A semiconductor device includes a substrate having a first surface on which an active region is disposed, and a second surface opposite the first surface, a buried conductive line extending in one direction and having a portion buried in the active region, an insulating portion covering the buried conductive line, a contact structure disposed on the insulating portion and connected to the buried conductive line, a through-hole extending from the second surface to the insulating portion and exposing the buried portion of the buried conductive line, an insulating isolation film disposed on a side surface of the buried conductive line and exposing a bottom surface of the buried portion and a side surface adjacent to the bottom surface, a through-via contacting the bottom surface and the adjacent side surface of the buried conductive line, an insulating liner surrounding the through-via.

20 Claims, 21 Drawing Sheets

SEMICONDUCTOR DEVICE

CROSS-REFERENCE TO RELATED APPLICATION(S)

This application claims the benefit under 35 USC 119(a) of Korean Patent Application No. 10-2020-0065110 filed on May 29, 2020 in the Korean Intellectual Property Office, the entire disclosure of which is herein incorporated by reference for all purposes.

BACKGROUND

1. Field

The present inventive concept relates to a semiconductor device.

2. Description of Related Art

In various semiconductor devices such as logic circuits and memories, source/drains are connected to metal wires of Back End Of Lines (BEOLs) through contact structures.

A method of forming a conductive through-structure such as a TSV from the backside of a substrate and landing the conductive through-structure on the conductive line located on the front side of the substrate is used to connect at least a portion (e.g., a power line) of the BEOLs to an element located on the backside of the substrate.

SUMMARY

Example embodiments provide a semiconductor device in which contact resistance of a conductive through-structure and a buried conductive line may be improved.

According to an exemplary embodiment of the present invention, a semiconductor device includes a substrate having a first surface and a second surface opposite each other, and being provided with an active region at the first surface, and active region having a plurality of fins extending in a first direction, a first isolation region defining the active region, a bottom surface of the first isolation region being lower than the topmost surface of the first surface of the substrate, a second isolation region defining the plurality of active fins, a bottom surface of the second isolation region being higher than the bottom surface of the first isolation region, a buried conductive line buried in the second isolation region, and extending in the first direction, an insulating isolation film including a first portion which is disposed between the second isolation region and the buried conductive line, an interlayer insulating layer disposed on the first isolation region and the second isolation region, and covering the buried conductive line, a contact structure penetrating through the interlayer insulating layer and connected to the buried conductive line, a through-hole extending toward the first surface of the substrate from the second surface of the substrate, and exposing a portion of the buried conductive line, the exposed portion of the buried conductive line extending beyond the bottom surface of the second isolation region toward the second surface of the substrate, a through-via disposed in the through-hole and contacting a bottom surface of the exposed portion of the buried conductive line and a side surface of the exposed portion of the buried conductive line, the side surface of the exposed portion of the buried conductive line being adjacent to the bottom surface of the exposed portion of the buried conductive line, and an insulating liner disposed between an inner sidewall of the through-hole and the through-via.

According to an exemplary embodiment of the present invention, a semiconductor device includes a substrate having a first surface and a second surface opposite the first surface, and being provided with an active region at the first surface, a buried conductive line disposed in the active region and extending in a first direction, the buried conductive line having a first portion and a second portion and the second portion of the buried conductive line being surrounded by the active region, an insulating layer disposed on the first surface of the substrate and covering the buried conductive line, the first portion of the buried conductive line being buried in the insulating layer, a contact structure disposed on the insulating layer and connected to the buried conductive line, a through-hole extending from the second surface of the substrate to the insulating layer and exposing the second portion of the buried conductive line, an insulating isolation film disposed on a side surface of the buried conductive line and surrounding the buried conductive line, the insulating isolation film exposing a bottom surface of the second portion of the buried conductive line and a side surface of the second portion of the buried conductive line, the side surface of the second portion of the buried conductive line being adjacent to the bottom surface of the second portion of the buried conductive line, a through-via disposed in the through-hole and contacting the bottom surface of the second portion of the buried conductive line and the side surface of the second portion of the buried conductive line, an insulating liner disposed between an inner side wall of the through-hole and the through-via, and a backside wiring disposed on the second surface of the substrate and connected to the through-via.

According to an exemplary embodiment of the present invention, a semiconductor device includes a substrate having a first surface and a second surface opposite the first surface, and having an active region on the first surface, a through-via extending from the second surface of the substrate toward the first surface thereof, an insulating layer disposed on the first surface of the substrate, a buried conductive line buried in the insulating layer and the through-via, and extending in a first direction, a contact structure disposed on the insulating layer and connected to the buried conductive line, an insulating isolation film disposed on a side surface of the buried conductive line and surrounding the buried conductive line, the insulating isolation film exposing a bottom surface of the buried conductive line and a side surface of the buried conductive line, the side surface of the buried conductive line being adjacent to the bottom surface thereof, an insulating liner disposed on a side surface of the through-via and configured to insulate the through-via from the active region of the substrate, and a backside wiring disposed on the second surface of the substrate and connected to the through-via.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments will be described in detail with reference to the accompanying drawings.

Figure 1:
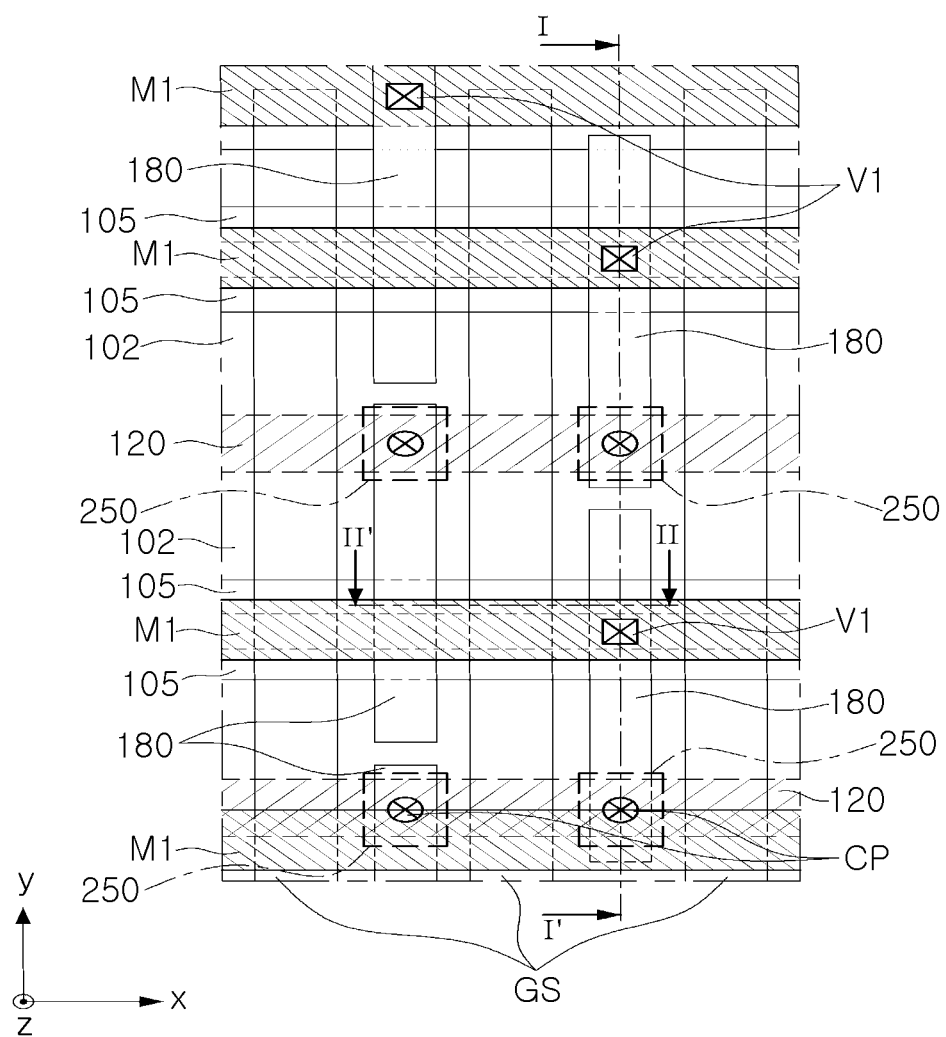
FIG. 1 is a plan view illustrating a semiconductor device according to an example embodiment.
Figure 2:
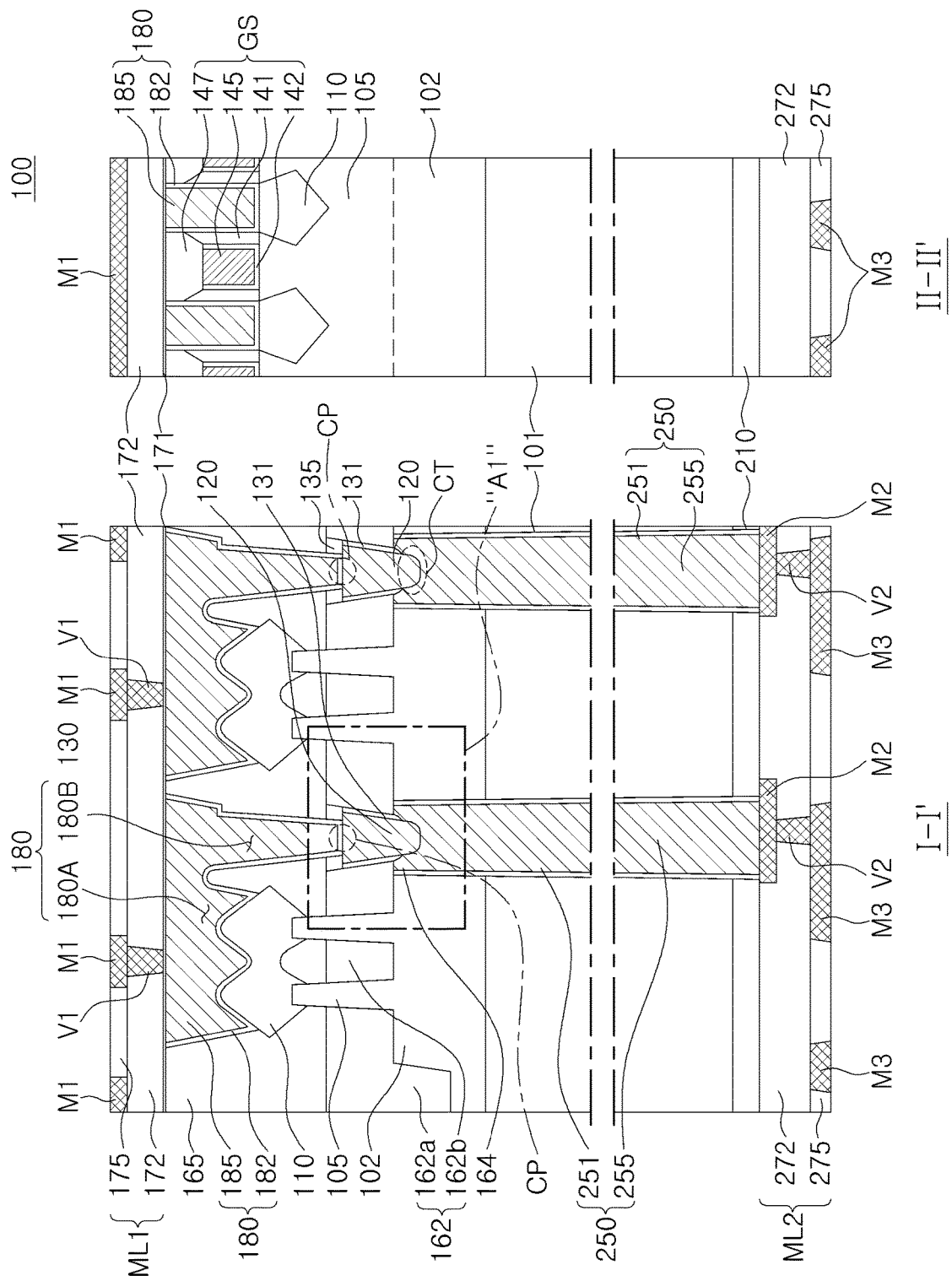
FIG. 2 is a cross-sectional view of the semiconductor device illustrated in FIG. 1 taken along line I-I' and line II-II'.
Figure 3:
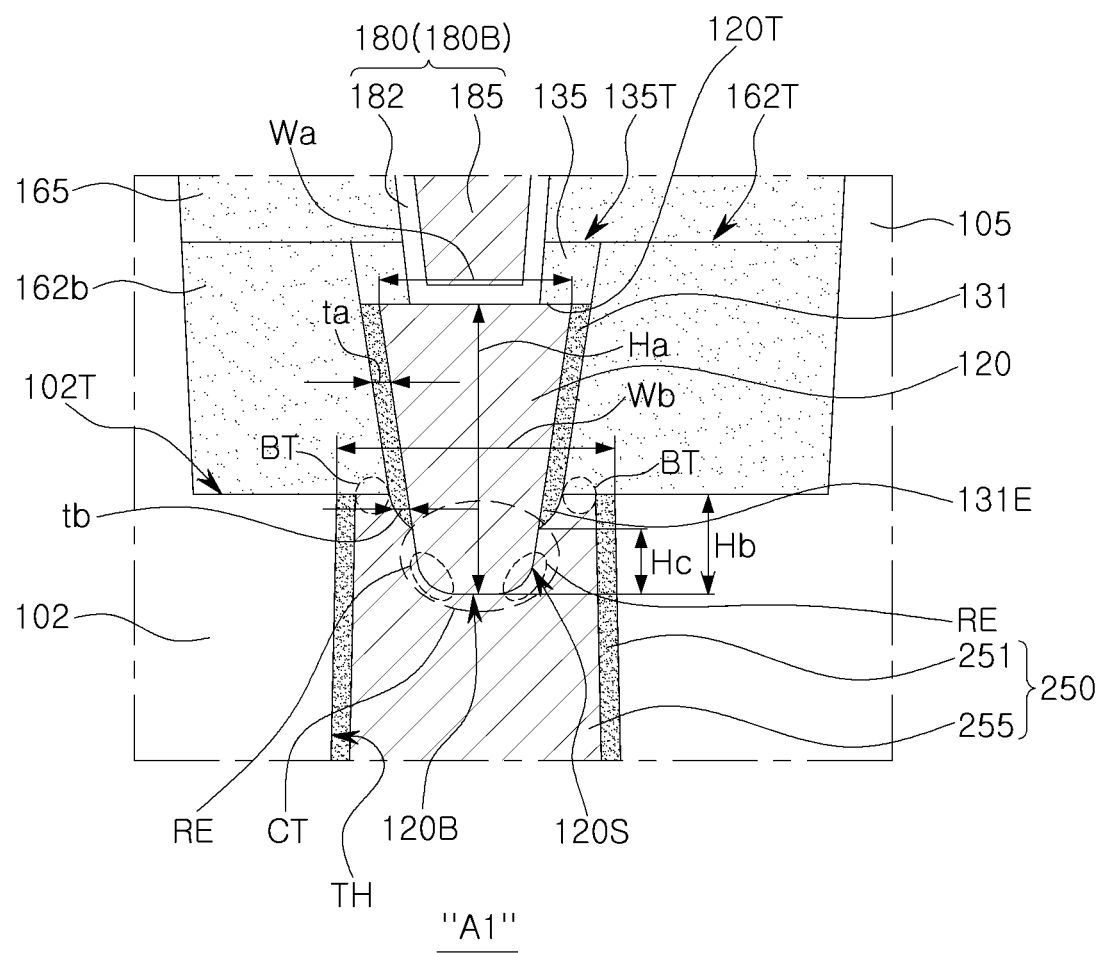
FIG. 3 is an enlarged cross-sectional view illustrating "A1" of the semiconductor device illustrated in FIG. 2.

FIG. 1 is a plan view illustrating a semiconductor device according to an example embodiment, and FIG. 2 is a cross-sectional view of the semiconductor device illustrated in FIG. 1 taken along line I-I' and line II-II'. FIG. 3 is an enlarged cross-sectional view illustrating "A1" of the semiconductor device illustrated in FIG. 2.

Referring to FIGS. 1 and 2, a semiconductor device 100 according to an example embodiment may include a substrate 101 having an active region 102. A plurality of active fins 105 may be disposed on an upper surface of the active region 102.

In some embodiments, the substrate 101 may include a semiconductor such as Si or Ge, or a compound semiconductor such as SiGe, SiC, GaAs, InAs, or InP. In another example, the substrate 101 may have a silicon-on-insulator (SOI) structure. The active region 102 may be a conductive region such as a well doped with impurities or a structure doped with impurities. In this embodiment, the active region 102 may be an n-type well for a P-MOS transistor or a p-type well for an N-MOS transistor, but is not limited thereto.

The plurality of active fins 105 respectively have a structure protruding upward (e.g., in a Z direction) from an upper surface of the active region 102. For example, the active fins 105 may protrude from a top surface of the substrate 101. It should be noted that in some embodiments, the active fins 105 may be part of the substrate, and in this manner, protruding from the substrate refers to protruding past a top surface of the substrate 101 (e.g., wherein the substrate 101 itself has protrusions that extend beyond a main surface thereof). As illustrated in FIG. 1, the plurality of active fins 105 may be arranged side by side on an upper surface of the active region 102 to extend in a first direction (e.g., an X direction). The active fin 105 may be provided as an active region of each transistor. In this embodiment, each source/drain region 110 may be provided on two active fins 105. The present invention is not limited thereto. In an example embodiment, each source/drain region 110 may be provided on one active fin 105 or three or more active fins 105.

The source/drain regions 110 (i.e., source/drains) may be formed in partial regions of the active fins 105 located on opposite sides of a gate structure GS, respectively. In this example embodiment, the source/drain region 110 may be formed to have an upper surface having a level higher than that of an upper surface of the active fin 105, by forming a recess in a partial region of the active fin 105 and performing selective epitaxial growth (SEG) in the recess. This source/drain region 110 is also referred to as a raised source/drain (RSD). For example, the source/drain region 110 may be formed of Si, SiGe, or Ge, and may have one conductivity type of N-type and P-type conductivity types. When forming the p-type source/drain region 110, regrowth is performed with SiGe, and doping may be performed using, for example, boron (B), indium (In), gallium (Ga), boron trifluoride ($BF_3$), or the like, as p-type impurities. When the n-type source/drain region 110 is formed using silicon (Si), doping may be formed using, for example, phosphorus (P), nitrogen (N), arsenic (As), antimony (Sb) or the like. Different shapes may be formed along the crystallographically stable surface during the growth process. For example, as illustrated in FIG. 2, the source/drain region 110 may have a pentagonal cross-section (in the case of p-type), but may alternatively have a hexagonal or a polygonal cross-section having a gentle angle (in the case of n-type).

The semiconductor device 100 according to the example embodiment may include a gate structure GS. Referring to FIG. 1, the gate structure GS may have a line shape extending in a second direction (e.g., a Y direction) intersecting the first direction (e.g., the X direction). The gate structure GS may overlap a portion of the active fins 105.

The gate structure GS employed in this embodiment may include gate spacers 141, a gate dielectric layer 142 and a gate electrode 145 sequentially disposed between the gate spacers 141, and a gate capping layer 147 disposed on the gate electrode 145 as illustrated in FIG. 2. For example, the gate spacers 141 may include an insulating material such as SiOCN, SiON, SiCN or SiN. For example, the gate dielectric layer 142 may be formed of a silicon oxide layer, a high-k dielectric layer, or a combination thereof. The high-k dielectric layer may include a material having a dielectric constant (e.g., about 10 to 25) higher than that of a silicon oxide layer. For example, the high-k dielectric layer may include a material selected from hafnium oxide, hafnium oxynitride, hafnium silicon oxide, lanthanum oxide, lanthanum aluminum oxide, and combinations thereof, but the material is not limited thereto. The gate dielectric layer 142 may be formed by an atomic layer deposition (ALD), chemical vapor deposition (CVD), or physical vapor deposition (PVD) process.

The semiconductor device 100 according to this embodiment may include a device isolation layer 162.

The device isolation layer 162 may include a first separation region 162a (i.e., a first isolation region) defining the active region 102 and a second separation region 162b (i.e., a second isolation region) defining the plurality of active fins 105 adjacent to the first separation region 162a. The first separation region 162a has a bottom surface deeper (i.e., lower) than that of the second separation region 162b. The first separation region 162a may also be referred to as deep trench isolation (DTI) having a first depth, and the second separation region 162b may also be referred to as shallow trench isolation (STI) having a second depth shallower than the first depth. The second separation region 162b may be disposed on an upper surface 102T of the active region 102. The active fin 105 may penetrate through the second separation region 162b to partially protrude upwardly beyond an upper surface of the second separation region 162b.

For example, the device isolation layer 162 may include silicon oxide or various silicon-based insulating materials. For example, the various insulating materials include Tetra Ethyl Ortho Silicate (TEOS), Undoped Silicate Glass (USG), PhosphoSilicate Glass (PSG), Borosilicate Glass (BSG), BoroPhosphoSilicate Glass (PSG), Fluoride Silicate Glass (FSG), Spin-On-Glass (SOG), Tonen SilaZene (TOSZ), or combinations thereof. The device isolation layer 162 may be formed using CVD or spin coating.

FIG. 3 is an enlarged cross-sectional view illustrating "A1" of the semiconductor device illustrated in FIG. 2.

Referring to FIG. 3 together with FIG. 2, the semiconductor device 100 according to this embodiment may include a buried conductive line 120 buried in the second separation region 162b and a through-via 255. A portion of the buried conductive line 120 may be surrounded by the active region 102. The buried conductive line 120 may be divided into a first portion buried in the second separation region 162b and a second portion buried in the through-via 255. The second portion of the buried conductive line 120 may be surrounded by the active region 102. In this embodiment, the buried conductive line 120 may be disposed between the plurality of active fins 105, and may extend in the first direction (e.g., the X direction), similar to the active fin 105, (see FIG. 1).

An insulating isolation film 131 may be disposed around the buried conductive line 120. The insulating isolation film 131 may be disposed between the second separation region 162b and the buried conductive line 120. As illustrated in FIG. 3, the insulating isolation film 131 surrounds a portion buried in the second separation region 162b, and exposes at least a bottom surface 120B and a side surface 120S of the buried conductive line 120 that is adjacent to the bottom surface 120B of the buried conductive line 120. These exposed surfaces may be provided as contact areas CT for the through-via 255 of the conductive through-structure 250.

As illustrated in FIG. 2, the conductive through-structure 250 may include a through-hole TH extending from a backside (e.g., a backside) of the substrate 101 toward the upper surface (e.g., a front side), the through-via 255 filling the through-hole TH, and an insulating liner 251 disposed between the inner sidewall of the through-hole TH and the through-via 255. For example, the conductive through-structure 250 may be a through-silicon via (TSV). The conductive through-structure 250 may be formed from the backside of the substrate 101 and connected to the contact region CT of the buried conductive line 120. The through-via 255 may be in contact with the bottom surface 120B of the buried conductive line 120 and the side surfaces 120S adjacent thereto.

The insulating isolation film 131 employed in this embodiment may have an extended portion 131E extending on a portion of a side surface of the buried portion of the buried conductive line 120. A thickness tb of the extended portion 131E may be less than a thickness ta of a portion between the second separation region 162b and the buried conductive line 120. For example, the thickness ta of the insulating isolation film 131 may range from 2 to 10 nm, and the extended portion 131E may have the thickness tb less than the thickness ta of the other portions. In this embodiment, as illustrated in FIG. 3, the extended portion 131E of the insulating isolation film 131 may have the thickness tb that increases as it approaches the second separation region 162b.

Since the extended portion 131E is a portion that remains after the process of etching a portion of the insulating isolation film located on the bottom surface 120B and adjacent side surfaces 120S of the buried conductive line 120 (see FIG. 11C), the extended portion 131E of the insulating isolation film 131 may be relatively thin compared to the portion of the insulating isolation film 131 between the second separation region 162b and the buried conductive line 120 and may have a tapered thickness as described above.

The bottom surface 120B of the buried conductive line 120 may have a rounded edge RE. In the etching process as described above, the exposed portion of the buried conductive line 120 may also be etched depending on the etch selectivity with respect to the constituent material of the insulating isolation film 131. As in this embodiment, when the etching selectivity is not relatively high, a portion of the exposed portion of the buried conductive line 120 (in detail, an edge portion) may be etched to have a rounded structure.

Referring to FIG. 3, as indicated by "BT", the upper end of the through-via 255 of the conductive through-structure 250 may contact the second separation region 162b. In this embodiment, the second separation region 162b, which is an insulator, is located around the buried conductive line 120, and an upper end width Wb of the conductive through-structure 250 is greater than an upper end width Wa of the buried conductive line 120. With the upper end width Wb of the conductive through-structure 250 greater than the upper end width Wa of the buried conductive line 120 which has a decreasing width toward the conductive through-structure 250, the formation of the conductive through-structure 250 may have a process margin such that the buried conductive line 120 is not in contact with the active region 102 (e.g., Si) even in a case in which the conductive through-structure 250 is misaligned with the buried conductive line 120. For example, the upper end width Wb of the conductive through-structure 250, for example, the through-hole TH, may be 30 nm to 100 nm.

As such, even when the conductive through-structure 250 is formed to have the upper end width Wb greater than the upper end width Wa of the buried conductive line 120 and the buried conductive line 120 is formed to penetrate through the active region 102, unwanted shorts that may occur when the conductive through-structure has misaligned landing on the buried conductive line 120 may be prevented. In an example embodiment, even when the conductive through-structure 250 is formed to have misaligned landing on the buried conductive line 120, the buried conductive line 120 which penetrates through the active region 102 is not short-circuited with the active region 102.

An interlayer insulating layer 165 may be disposed on the device isolation layer 162 to cover the source/drain regions 110 and the buried conductive line 120. The device isolation layer 162 may further include an insulating capping layer 135 that covers the buried conductive line 120. The insulating capping layer 135 may have an upper surface 135T that is substantially coplanar with an upper surface 162T of the device isolation layer 162. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The interlayer insulating layer 165 and/or the insulating capping layer 135 may be formed of the same or similar material as the above-described material of the device isolation layer 162. Even when formed of the same material (e.g., oxide), the insulating capping layer 135, the device isolation layer 162, and/or the interlayer insulating layer 165 may be visually distinguished by the interface thereof. In detail, the device isolation layer 162, the interlayer insulating layer 165, and the insulating capping layer 135 may have different film quality when formed by different processes, and these different levels of film quality may be visually distinguished. In this specification, the device isolation layer 162 and the interlayer insulating layer 165 are also referred to as "an insulating portion" or "an insulating layer". The insulating portion may be disposed on the upper surface of the substrate 101 (e.g., the active region 102) to cover the buried conductive line 120.

The buried conductive line 120 employed in this embodiment may have an upper surface 120T lower than an upper end of the active fin 105. The upper surface 120T of buried conductive line 120 may have the upper end width Wa. The buried conductive line 120 is not exposed externally in the process of forming the source/drain 110. The upper surface of 120T of the buried conductive line 120 may be higher than the upper surface 102T of the active region 102. The buried conductive line 120 may be electrically connected to a contact structure 180.

In an example embodiment, the buried conductive line 120 may be formed to have an aspect ratio of 2 or more. For example, the upper end width Wa of the buried conductive line 120 may be 10 nm to 50 nm, and in a specific example, may be 20 nm to 40 nm. A height Ha of the buried conductive line 120 may be 30 nm to 200 nm. The aspect ratio of the buried conductive line 120 may correspond to a value obtained by dividing the height Ha with the upper end width Wa.

As described above, the buried conductive line 120 may have the second portion buried in the through-via 255 of the conductive through-structure 250 and surrounded by the active region 102. The second portion of the buried portion may be provided as the contact area CT with the conductive through-structure 250. For example, the height or depth Hb of the buried portion may be at least 10 nm in consideration of the contact area CT, and a height Hc of the exposed side surfaces 120S provided as the contact area CT may be at least 3 nm. As in this embodiment, when the bottom surface 120B of the buried conductive line 120 has a rounded edge RE, as illustrated in FIG. 3, the height Hc of the exposed side surfaces 120S may be defined as a height of a highest point of the exposed side surfaces 120S in the vertical direction, based on a lowest point of the bottom surface 120B.

As described above, in this embodiment, the side surfaces 120S, in addition to the bottom surface 120B, are provided as the contact area CT with the through-via 255, and thus, contact resistance of the buried conductive line 120 and the conductive through-structure 250 may be significantly lowered compared to when the contact area CT is formed only with the bottom surface 120B.

The contact structure 180 employed in this embodiment may connect the source/drain region 110 and the buried conductive line 120 to each other. The contact structure 180 may include a conductive barrier 182 and a contact plug 185. The contact structure 180 includes a first contact portion 180A which is connected to the source/drain region 110 and a second contact portion 180B which is connected to the buried conductive line 120. The second contact portion 180B may extend to be deeper than the first contact portion 180A to be electrically connected to the buried conductive line 120. An example of arrangement of contact points CP between the second contact portion 180B and the buried conductive line 120 may be shown in FIG. 1.

The contact structure 180 may be connected to a first wiring portion ML1 constituting a back end of lines (BEOL). The first wiring portion ML1 may be configured to interconnect a plurality of devices (e.g., transistors) implemented on the upper surface (i.e., a first side) of the substrate 101, in detail, the active region 102.

The first wiring portion ML1 may include a plurality of low-dielectric layers 172 and 175, a metal wiring M1, and a metal via V1. The plurality of low-dielectric layers (172 and 175) may include first and second low-dielectric layers 172 and 175 disposed on the interlayer insulating layer 165. The metal wiring M1 may be formed in the second low-dielectric layer 175, and the metal via V1 may be formed in the first low-dielectric layer 172. Each of the metal vias V1 may connect the contact structure 180 and the metal wiring M1 to each other (see FIGS. 1 and 2).

For example, the first and second low-dielectric layers 172 and 175 may include a silicon oxide film, a silicon oxynitride film, a SiOC film, a SiCOH film, or combinations thereof. For example, the metal wiring M1 and the metal via V1 may include copper or a copper-containing alloy. The metal wiring M1 and the metal via V1 may be formed together using a dual-damascene process.

As in this embodiment, an etch stop layer 171 disposed between the interlayer insulating layer 165 and the first low-dielectric layer 172 may be further included. The etch stop layer 171 not only serves as an etch stopper, but also prevents metal (e.g., Cu) constituting the metal wiring M1 and the metal via V1 from diffusing to the lower region. For example, the material of the etch stop layer 171 is not limited thereto, and may include aluminum nitride (AlN).

In this embodiment, the contact structure 180 connected to a plurality of elements (e.g., the source/drain regions 110, etc.) formed on the substrate 101 may be connected to a second wiring portion ML2 located on the backside (i.e., a second side) of the substrate 101 through the buried conductive line 120 and the conductive through-structure 250.

The second wiring portion ML2 employed in this embodiment may be a power line and/or signal lines implemented on the backside of the substrate 101 and may be understood as a wiring portion (i.e., a wiring) that replaces a portion of the BEOL. The second wiring portion ML2 that is located on the backside of the substrate 101 may be referred to as a "backside wiring portion" or a "backside wiring".

The second wiring portion ML2 may provide signal lines and/or power lines for a plurality of devices (e.g., transistors) implemented on the upper surface of the substrate 101, through the buried conductive line 120 and the conductive through-structure 250.

The conductive through-structure 250 may be formed on the backside of the substrate 101 after a backside insulating layer 210 is formed. The second wiring portion ML2 may be provided on the backside insulating layer 210. The second wiring portion ML2 may include a plurality of low-dielectric layers 272 and 275, first and second metal wirings M2 and M3, and metal vias V2. The plurality of low-dielectric layers may include first and second low-k dielectric layers 272 and 255 sequentially disposed on the backside insulating layer 210. The first and second metal wirings M2 and M3 are formed on the backside insulating layer 210. The first and second metal wirings M2 and M3 may be formed in the first low-k dielectric layer 272 and the second low-k dielectric layer 275, respectively. The metal via V2 connecting the first and second metal wirings M2 and M3 may be formed in the first low-k dielectric layer 272. The second metal wiring M3 and the metal via V2 may be formed using a dual damascene process. The first metal wiring M2 may be formed to be connected to the conductive through-structure 250.

Figure 4:
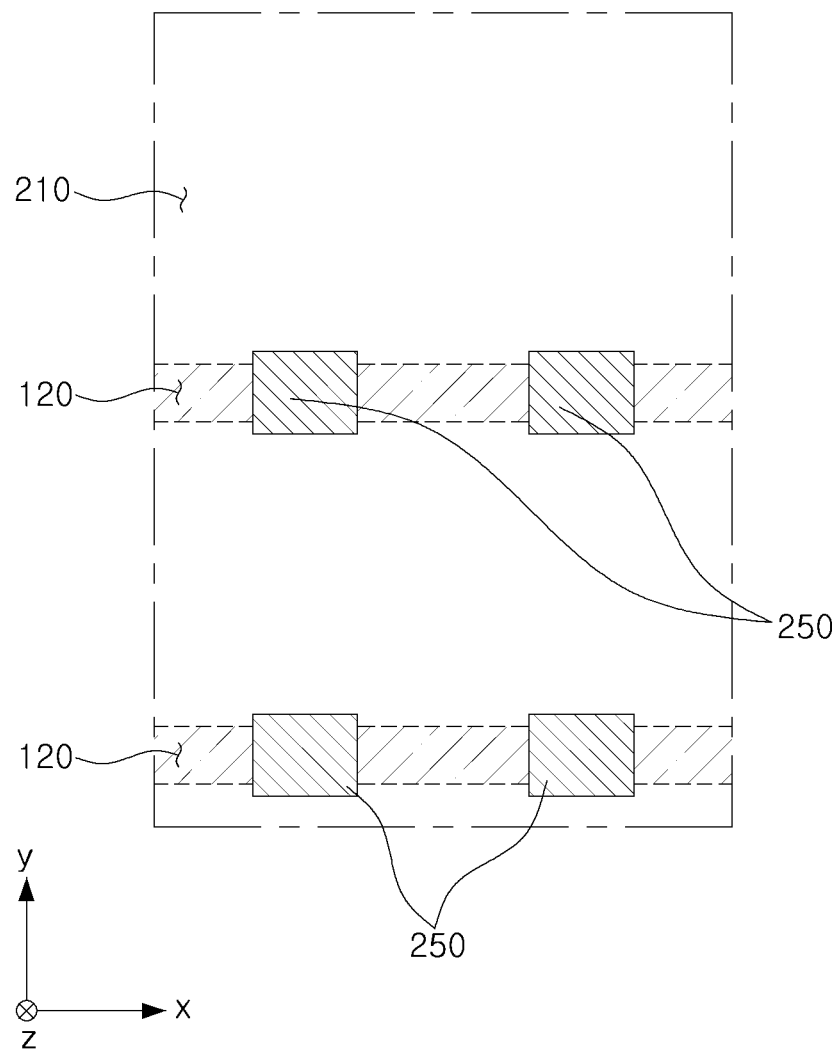
FIG. 4 is a rear view illustrating a semiconductor device according to an example embodiment.

FIG. 4 illustrates the layout of the conductive through-structure 250 and the buried conductive line 120 as viewed from the backside of the substrate 101. A plurality of conductive through-structures 250 may be arranged to be connected to the buried conductive line 120 extending in the first direction (e.g., the X direction). The cross section of the conductive through-structure 250 is substantially rectangular in which the length of the first direction (e.g., the X direction) is greater than the length of the second direction perpendicular to the first direction. The present invention is not limited thereto. In an example embodiment, the conductive through-structure 250 may have a variety of different shapes (e.g., a circular, an oval). In an example embodiment, the conductive through-structure 250 may be arranged on the same line in the second direction (e.g., Y direction), but in another embodiment, the conductive through-structure 250 may have a different array. For example, the conductive through-structure 250 may be disposed to be offset from other conductive through-structures 250 adjacent in the second direction (e.g., Y direction).

Wirings such as signal lines and power lines required for the semiconductor device 100 may be implemented on the backside of the substrate 101 by using the buried conductive line 120 and the conductive through-structure 250.

The second wiring portion ML2 employed in this embodiment is illustrated in the form implemented with the first wiring portion ML1 disposed on the upper surface of the substrate 101, for example, the upper portion of the device region. In an example embodiment, all of the necessary BEOL may be implemented as the second wiring portion ML2 located on the backside of the substrate 101 by using the buried conductive line 120 and the conductive through-structure 250, or the first wiring portion ML1 may also be significantly reduced or omitted.

In an example embodiment, the conductive through-structure 250 may include a conductive barrier (not illustrated) formed inside the through-hole TH in which the insulating liner 251 is formed. Similarly, a conductive barrier (not illustrated) may be additionally formed on the bottom surface and the entire side surface of the buried conductive line 120, and the conductive barrier may remain in the contact region. For example, at least one of the buried conductive line 120, the contact plug 185, and the through-via 255 may include Cu, Co, Mo, Ru, W or alloys thereof. For example, the insulating isolation film 131, the insulating cap layer 135, and the insulating liner 251 may include SiO2, SiN, SiCN, SiC, SiCOH, SiON, Al2O3, AlN, or a porous material thereof. For example, the conductive barrier 182 may include Ta, TaN, Mn, MnN, WN, Ti, TiN, or combinations thereof. Also, the contact structure 180 may include a metal silicide layer (not illustrated) disposed between the conductive barrier 182 and the source/drain regions 110. For example, the metal silicide layer may be formed of a material such as CoSi, NiSi or TiSi.

The above-described embodiment may be implemented by variously changing, for example, the contact area of the buried conductive line and the position of the conductive through-structure.

Figure 5A:
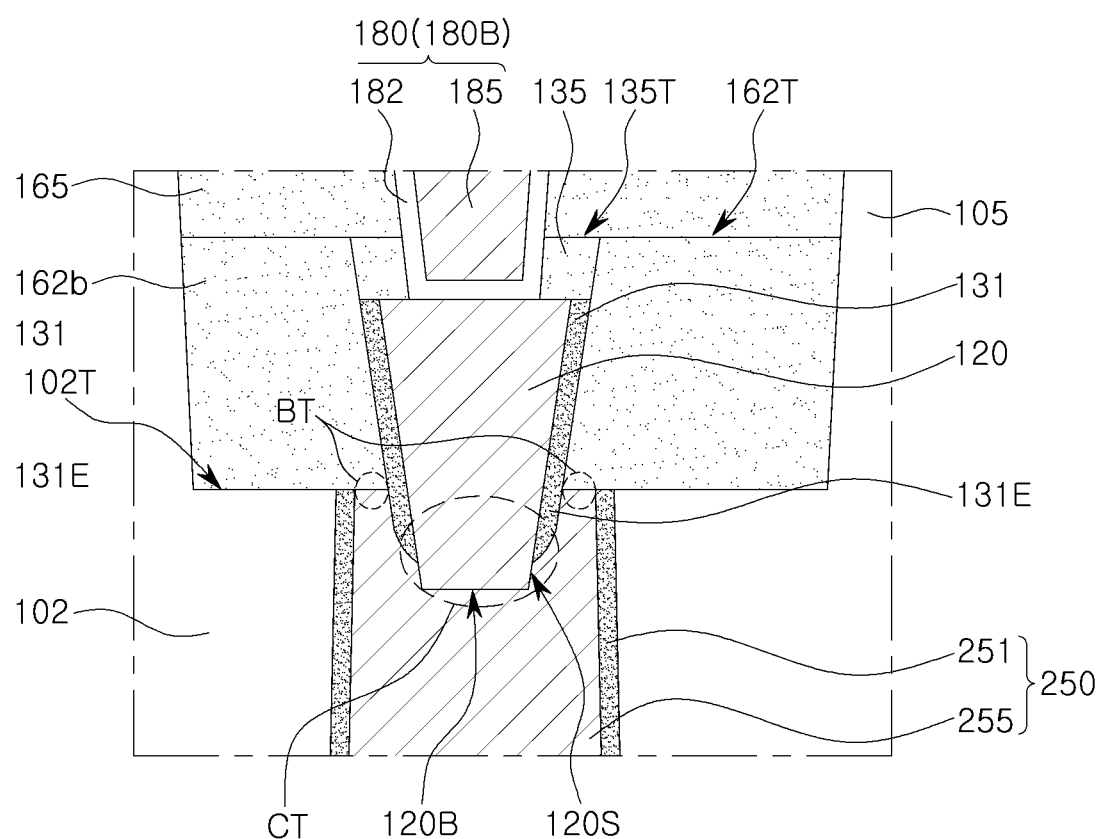
FIGS. 5A to 5C are partial cross-sectional views illustrating semiconductor devices according to various embodiments.
Figure 5B:
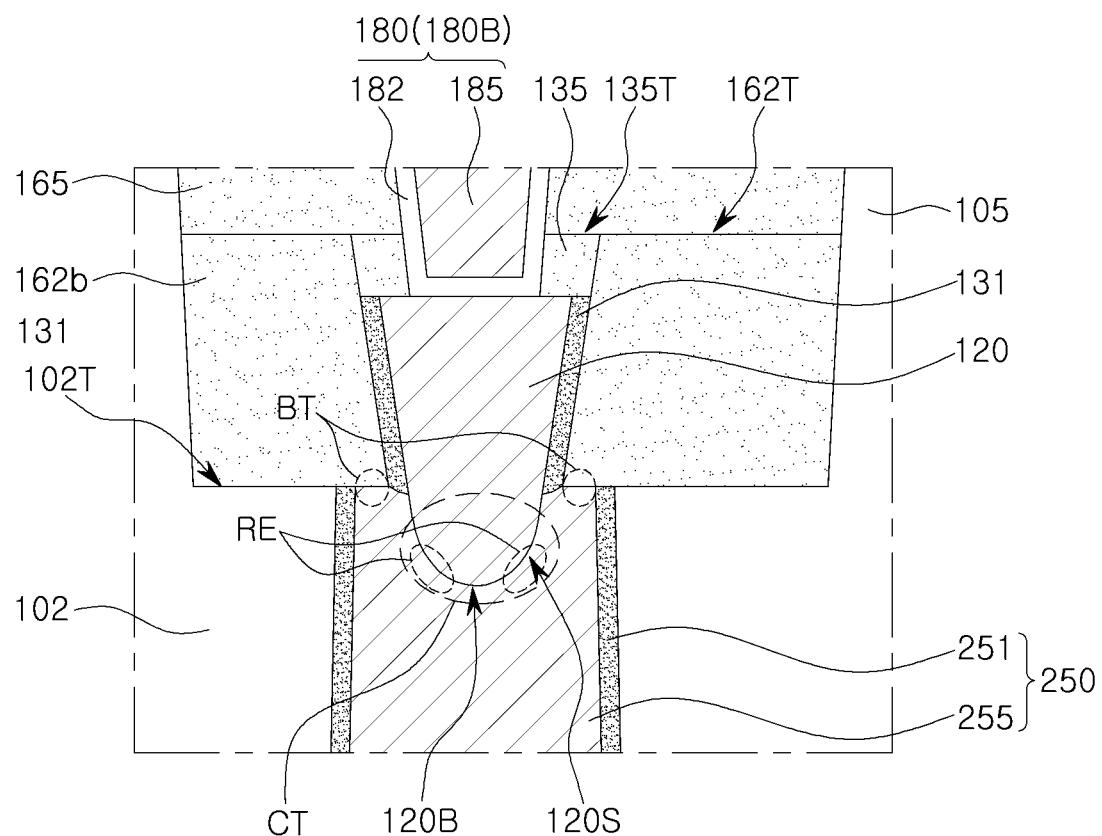
Figure 5C:
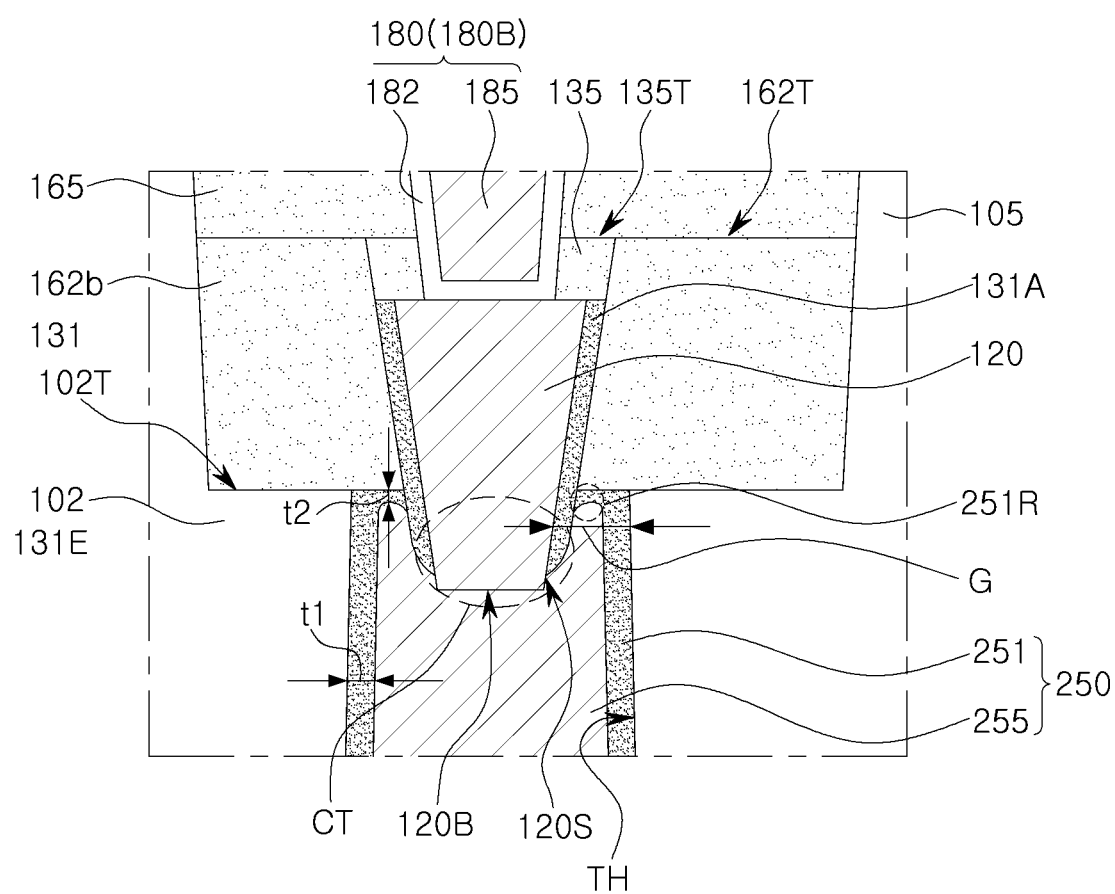

FIGS. 5A to 5C are partial cross-sectional views illustrating a semiconductor device according to various embodiments.

FIG. 5A is a cross-sectional view illustrating a semiconductor device according to an example embodiment, and corresponds to an enlarged cross-section of the "A1" region, similar to the enlarged cross-sectional view illustrated in FIG. 3, of the semiconductor device illustrated in FIG. 1.

Referring to FIG. 5A, the semiconductor device 100A may be understood as having a structure similar to the semiconductor device 100 illustrated in FIGS. 1 to 3, except that the shapes of an extended portion 131E of the insulating isolation film 131 and the contact region CT of the buried conductive line 120 are different. The components of this embodiment may be understood by referring to the description of the same or similar components of the semiconductor device 100 illustrated in FIGS. 1 to 3, unless specifically stated otherwise.

The extended portion 131E of the insulating isolation film 131 employed in this embodiment may have a relatively longer length than the previous embodiment. The extended portion 131E may be disposed to expose a portion of the side surfaces 120S adjacent to the bottom surface 120B of the buried conductive line 120. The exposed side surfaces 120S and the bottom surface 120B of the buried conductive line 120 may provide a contact area CT. The thickness of the extended portion 131E may be less than that of other portions, for example, a portion between the second separation region 162b and the buried conductive line 120. The extended portion 131E may have a reduced thickness as it approaches the bottom surface 120B.

On the other hand, the contact region CT of the buried conductive line 120 may have an angled shape. For example, the edge of the bottom surface 120B of the buried conductive line 120 may maintain a relatively angular shape unlike the rounded edge (RE in FIG. 3) of the previous embodiment.

These differences from the previous embodiment (e.g., the length of the extended portion 131E and the shape of the contact region) may be caused by a difference in partial etching process conditions performed on a preliminary insulating liner 251P and a preliminary insulating isolation film 131P for exposing the contact region CT. The partial etching process will be described with reference to FIGS. 11A to 11C. For example, it can be understood that this embodiment is as a result obtained by setting the etching process time to be relatively short, or by setting the etching process conditions to have a relatively high etching selectivity between the material of the insulating liner 251 and the material of the buried conductive line 120.

The residual degree of the extended portion 131E, for example, the area of the adjacent side surface 120S provided as the contact area CT may vary according to the side inclination angle of the side surface 120S of the buried conductive line 120 with respect to the bottom surface 120B thereof. For example, as the side inclination angle of the buried conductive line 120 is closer to the vertical, the amount of etching with respect to the extended portion is reduced, and thus, the area of the adjacent side surface 120S may be relatively reduced in the same etching condition. The partial etching conditions for exposing the contact region CT may be controlled such that to induce etching on the side of the buried conductive line 120 to secure the area of the adjacent side surface 120S, the side tilt angle of the side surface of the 120S of the buried conductive line 120 is smaller than the tilt angle of the inner sidewall of a through-hole TH.

FIG. 5B is a cross-sectional view illustrating a semiconductor device 100A' according to an example embodiment.

Referring to FIG. 5B, the semiconductor device 100A' has almost no extended portion of the insulating isolation film 131, and may be understood as having a structure similar to that of the semiconductor device 100 illustrated in FIGS. 1 to 3, except that the shape of the contact area CT of the buried conductive line 120 is different. The components of this embodiment may be understood by referring to the description of the same or similar components of the semiconductor device 100 illustrated in FIGS. 1 to 3, unless specifically stated otherwise.

An insulating isolation film 131 employed in this embodiment does not extend to a portion of the buried conductive line 120 located in the active region 102. For example, in the through-hole, the buried conductive line 120 may be exposed in almost entire portions of the bottom surface 120B and side surfaces 120S adjacent thereto, and thus, the exposed side surfaces 120S and bottom surface 120B may provide a contact area CT. The contact area CT according to this embodiment may be secured with a relatively large area than the previous embodiments (FIGS. 3 and 5A). Although not clearly illustrated, a region BT of the second separation region 162b is in contact with the through-via 255 with a recess extending in the upper direction of the substrate.

The contact area CT of the buried conductive line 120 may have a round structure RE such that the boundary between the bottom surface 120B and the side surfaces 120S is not clear. This embodiment may be understood as a result obtained by setting the etching process time to be relatively long or setting the etching process conditions to have a relatively low etch selectivity between the material of the insulating liner 251 and the material of the buried conductive line 120.

FIG. 5C is a cross-sectional view illustrating a semiconductor device 100A″ according to an example embodiment.

Referring to FIG. 5C, the semiconductor device 100A″ has a structure similar to that of the semiconductor device 100A illustrated in FIG. 5A, except that an insulating liner 251 partially remains at the top of the through-hole TH. The components of this embodiment are described in the same or similar components of the semiconductor devices 100 and 100A illustrated in FIGS. 1 to 3 and 5A, unless otherwise specified.

In this embodiment, the insulating liner 251 may have a residual portion 251R partially remaining on an upper end of the through-hole TH. In the previous embodiment, when removing the insulating liner portion and the insulating isolation film portion located on the bottom surface 120B of the buried conductive line 120, since the insulating liner portion located on the upper end of the through-hole TH is also removed (see FIG. 11C), the through-via 255 and the second separation region 162b are in direct contact with each other (see "BT" in FIG. 3). However, when a gap G between the inner sidewall of the through-hole TH and the side surface of the buried conductive line 120 is narrow compared to a required thickness t1 of the insulating liner 251, a significant portion of the gap G space may be filled by an insulating liner material when the insulating liner 251' is deposited (see FIG. 11B).

As a result, as illustrated in FIG. 5C, even when the insulating liner portion and the insulating isolation film portion located on the bottom surface 120B of the buried conductive line 120 are removed, the residual portion 251R of the insulating liner 251 may remain on the upper end of the through-hole TH. A thickness t2 of the residual portion 251R may be different from a thickness t1 of the insulating liner 251. For example, as in this embodiment, a thickness t2 of the residual portion 251R may be less than a thickness t1 of the insulating liner 251.

As such, the extended portion 131E and the contact area may have various sizes and shapes due to the etching process conditions and/or structural differences for exposing the contact area CT (e.g., the side inclination angle of the buried conductive line 120 and the size of the gap G).

Figure 6A:
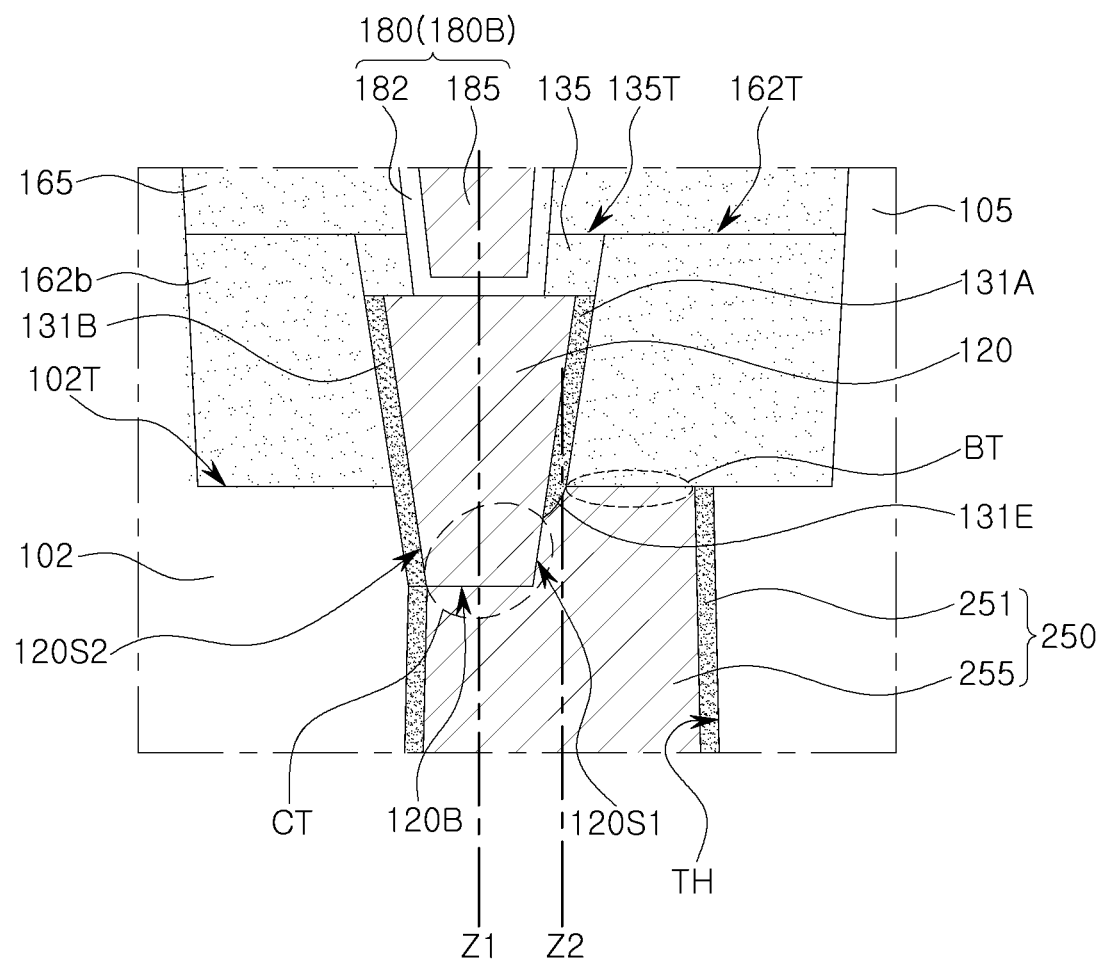
FIGS. 6A and 6B are partial cross-sectional views illustrating semiconductor devices according to various embodiments.
Figure 6B:
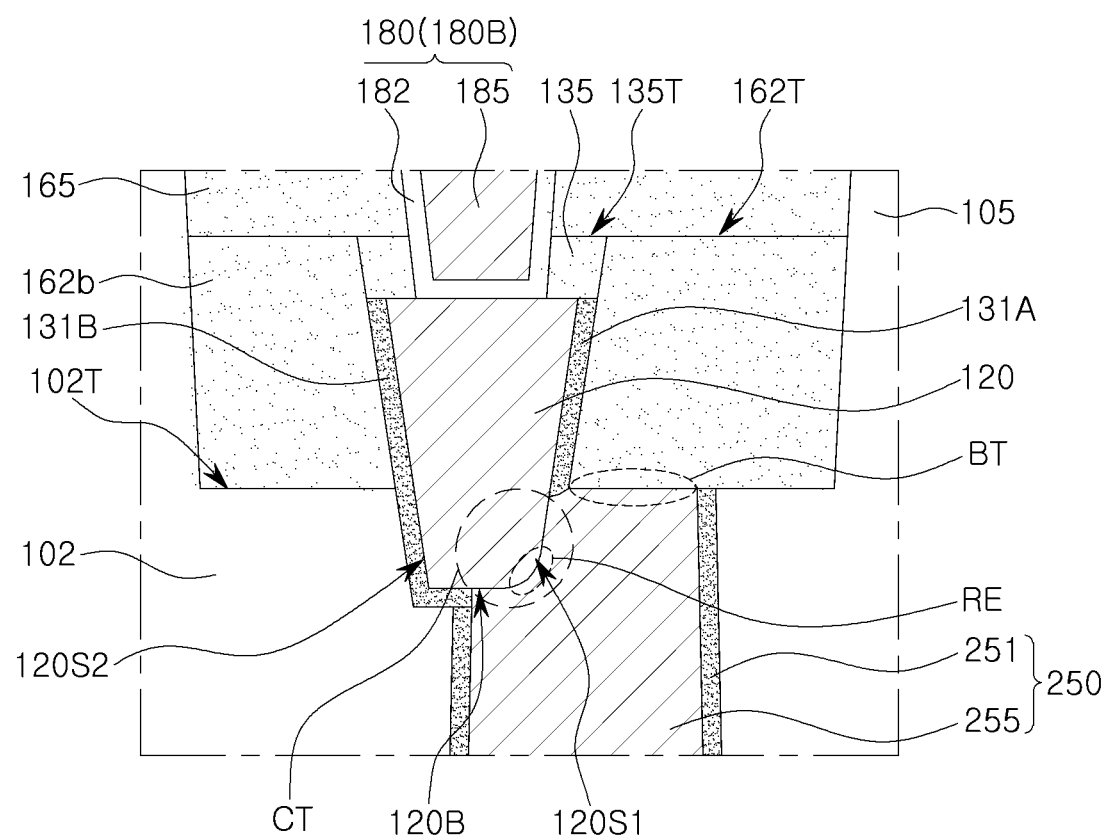

FIGS. 6A and 6B are partial cross-sectional views illustrating a semiconductor device according to various embodiments.

First, referring to FIG. 6A, the semiconductor device 100B may be understood to have a structure similar to that of the semiconductor device 100 illustrated in FIGS. 1 to 3, except that the buried conductive line 120 and the conductive through-structure 250 are disposed to be slightly offset. Components of this embodiment may be understood with reference to descriptions of the same or similar components of the semiconductor device 100 illustrated in FIGS. 1 to 3, unless specifically stated otherwise.

In this embodiment, a central axis Z1 of the buried conductive line 120 may be offset from a central axis Z2 of the conductive through-structure 250. FIG. 6A is a cross-section taken in a second direction (e.g., a Y direction) in the plan view of FIG. 1, and such an offset may be an offset in the Y direction. This offset may occur in the process of forming the through-hole TH for the conductive through-structure 250 (see FIG. 11A).

The buried conductive line 120 has a first side surface 120S1 and a second side surface 120S2, which are disposed opposite to each other and disposed in the Y direction. The first and second side surfaces 120S1 and 120S2 may extend in a direction in which the buried conductive line 120 extends (e.g., an X direction) (see FIG. 1).

A portion of the first side surface 120S1 is in contact with the through-via 255, similar to the previous embodiment, and another portion of the first side surface 120S1 may be covered with an extended portion 131E of the first insulating isolation film 131A. The second side surface 120S2 may be electrically separated from the active region 102 by a second insulating isolation film 131B.

Referring to FIG. 6B, the semiconductor device 100B' may be understood to have a structure similar to that of the semiconductor device 100B illustrated in FIG. 6A, except that the offset positions of the conductive through-structures 250 are different. The components of this embodiment may be understood by referring to the description of the same or similar components of the semiconductor devices 100 and 100B illustrated in FIGS. 1 to 3 and 6A, unless otherwise specified.

In this embodiment, the offset degree of the conductive through-structure 250 is greater than that of the example embodiment illustrated in FIG. 6A. The conductive through-structure 250 may be connected to only a portion of the bottom surface 120B of the buried conductive line 12.

Similar to the previous embodiment (FIG. 6A), the buried conductive line 120 has a first side surface 120S1 and a second side surface 120S2 opposite each other, and the first and second side surfaces 120S1 an 120S2 may extend in a direction in which the buried conductive line 120 extends. In this embodiment, the first side surface 120S1 may contact the through-via 255 almost entirely, and the second side surface 120S2 may be electrically insulated from the active region 102 by the second insulating isolation film 131B.

As illustrated in FIGS. 6A and 6B, even when a slight error occurs when the conductive through-structure 250 is misalignly landed on the buried conductive line 120, not only the bottom surface 120B of the buried conductive line 120, but also at least a portion of the first side surface 120S1 adjacent thereto may be exposed. Those exposed surfaces 120B and 120S1 may serve as a contact area CT for connection to the through-via 255, thereby reducing contact resistance.

Figure 7:
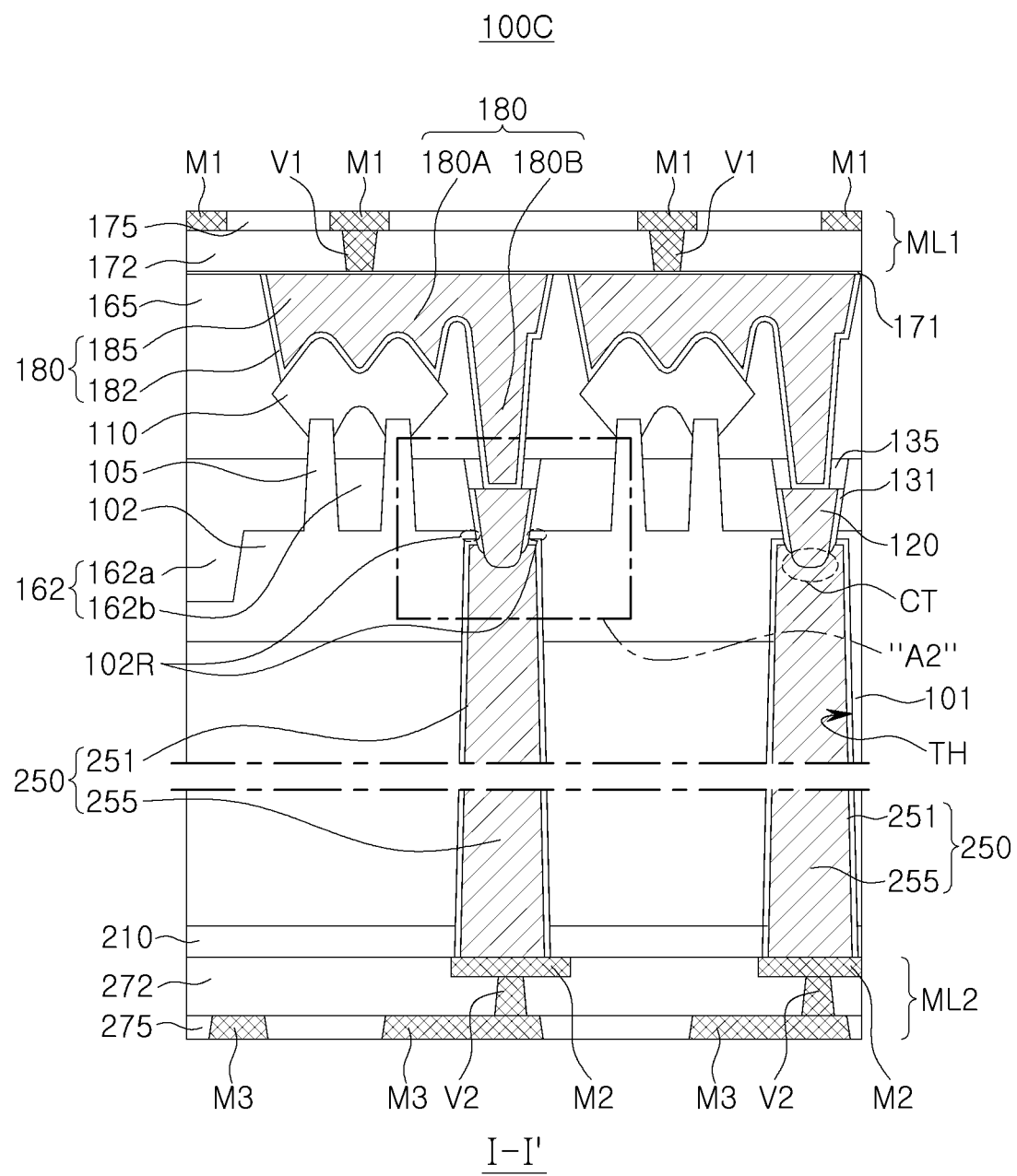
FIG. 7 is a cross-sectional view illustrating a semiconductor device according to an example embodiment.
Figure 8:
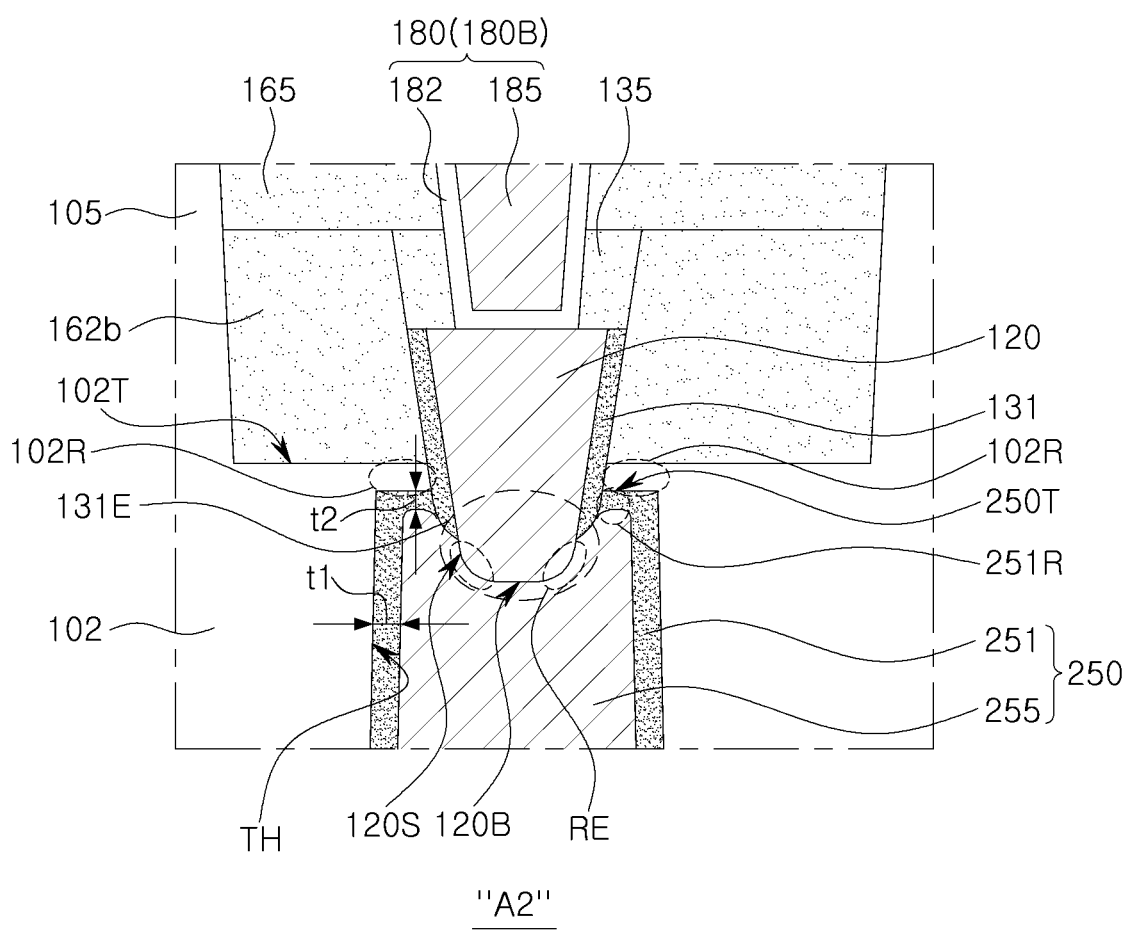
FIG. 8 is an enlarged cross-sectional view illustrating "A2" of the semiconductor device illustrated in FIG. 7.

FIG. 7 is a cross-sectional view illustrating a semiconductor device according to an example embodiment, and FIG. 8 is an enlarged cross-sectional view illustrating "A2" of the semiconductor device illustrated in FIG. 7.

Referring to FIGS. 7 and 8, a semiconductor device 100C according to the embodiment may be understood to have a structure similar to that of the semiconductor device 100 illustrated in FIGS. 1 to 3, except that the upper surface of the through-hole TH for the conductive through-structure 250 is positioned lower than an upper surface 102T of the active region 102. The components of this embodiment may be understood by referring to the description of the same or similar components of the semiconductor device 100 illustrated in FIGS. 1 to 3, unless specifically stated otherwise.

The semiconductor device 100C according to this embodiment may include a substrate 101 having an active region 102, similar to the example embodiment illustrated in FIGS. 1 to 3. A plurality of active fins 105 may be disposed on the active region 102.

The through-hole TH has an upper surface 250T lower than the upper surface 102T of the active region 102. A portion 102R of the active region 102 is exposed by the upper surface 250T of the through-hole TH, and the exposed portion 102R of the active region 102 may be electrically insulated from the through-via 255 by the insulating liner 251.

A residual portion 251R of the insulating liner 251 may be located on the upper surface 250T of the through-hole TH with a thickness t2 different from the thickness t1 of the portion of the insulating liner 251 located on the inner sidewall of the through-hole TH. The residual portion 251R may connect the portion of the insulating liner 251 located on the inner sidewall of the through-hole TH and the insulating isolation film 131 to each other.

The buried conductive line 120 may provide a contact region CT with the through-via 255 by the bottom surface 120B and the side surfaces 120S adjacent thereto. The bottom surface 120B of the buried conductive line 120 may have a rounded edge RE. As illustrated in FIG. 8, the extended portion 131E of the insulating isolation film 131 may have a thickness that increases as it approaches the second separation region 162b.

Figure 9:
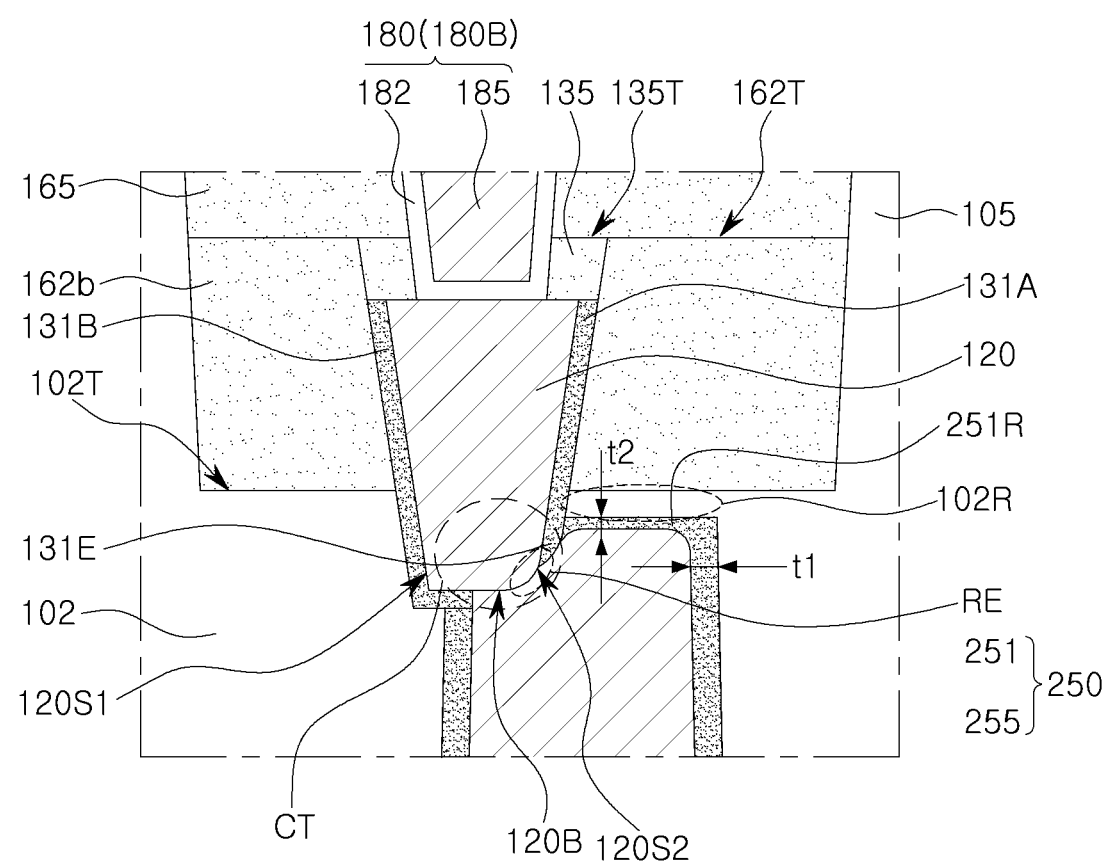
FIG. 9 is an enlarged cross-sectional view illustrating a semiconductor device according to an example embodiment.

FIG. 9 is a partial cross-sectional view illustrating a semiconductor device according to an example embodiment.

Referring to FIG. 9, a semiconductor device 100C' may be understood to have a structure similar to that of the semiconductor device 100C illustrated in FIGS. 7 and 8, except that the buried conductive line 120 and the conductive through-structure 250 are disposed to be slightly offset. The components of this embodiment will be understood by referring to the description of the same or similar components of the semiconductor devices 100 and 100C illustrated in FIGS. 1 to 3, 7 and 8, unless otherwise specified.

In this embodiment, the central axis of the buried conductive line 120 and the central axis of the conductive through-structure 250 may be offset from each other. As described above, this offset may be generated in the process of forming the through-hole TH for the conductive through-structure 250 (see FIG. 11A).

The buried conductive line 120 may have a first side surface 120S1 and a second side surface 120S2 located to oppose each other, and the first and second side surfaces 120S1 and 120S2 may extend in a direction in which the buried conductive line 120 extends. Similar to the previous embodiment (FIG. 6A), a portion of the first side surface 120S1 contacts the through-via 255, while another portion of the first side surface 120S1 is disposed by an extended portion 131E of a first insulating isolation film 131A. The second side surface 120S2 may be electrically separated from the active region 102 by the second insulating isolation film 131B.

A method of manufacturing a semiconductor device according to this embodiment will be described by classifying the device portion and first wiring portion forming process (see FIGS. 10A to 10E) and the conductive through-structure and second wiring portion forming process (see FIGS. 11A to 11D). The semiconductor device manufacturing method according to this embodiment may be understood as a manufacturing method of the semiconductor device 100 illustrated in FIG. 3.

FIGS. 10A to 10E are cross-sectional views of describing a method of manufacturing a semiconductor device illustrated in FIG. 1 (e.g., a process of forming a device portion and a first wiring portion).

Figure 10A:
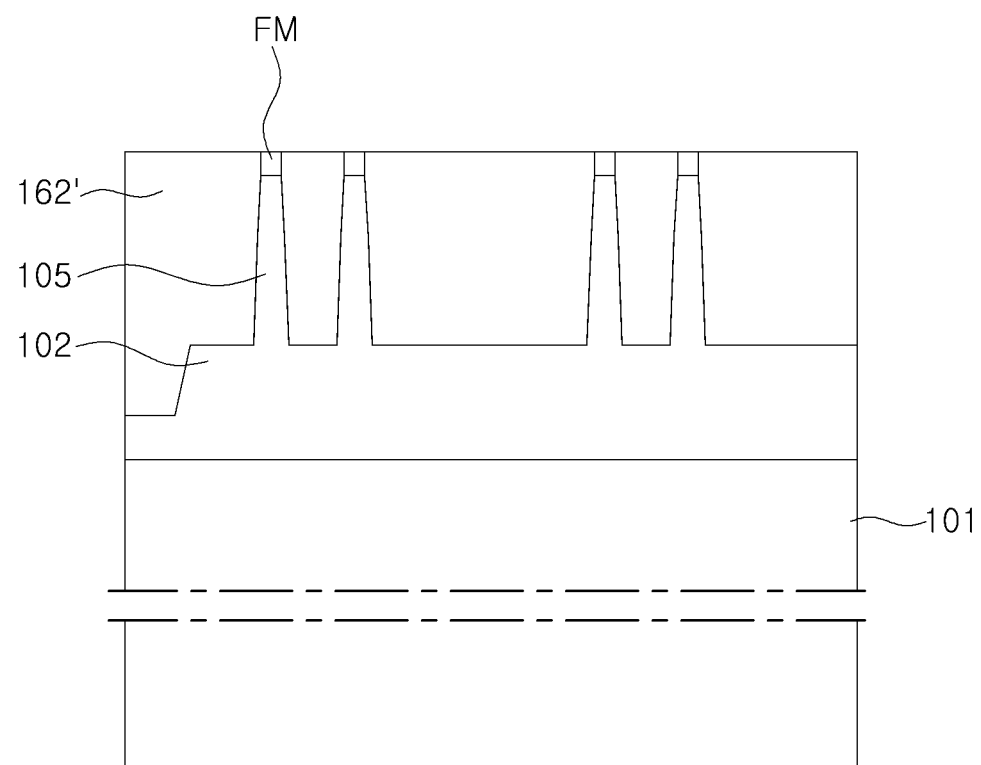
FIGS. 10A to 10E are cross-sectional views of illustrating a method of manufacturing a semiconductor device illustrated in FIG. 1.

First, referring to FIG. 10A, a first insulating layer 162' covering a plurality of active fins 105 may be formed.

A fin mask FM may be disposed on the plurality of respective active fins 105. The fin mask FM may be a mask that has been used in a process for forming a plurality of active fins 105 prior to this process. The first insulating layer 162' is formed on a substrate 101 to cover the plurality of active fins 105. In this process, after forming the first insulating layer 162' to cover the fin mask FM, the first insulating layer 162' may be planarized using a process such as chemical-mechanical polishing (CMP) so that the fin mask FM is exposed. In some embodiments, prior to this process, a process of removing some active fins from the region in which the buried conductive line (120 in FIG. 10C) is to be formed may be performed.

Figure 10B:
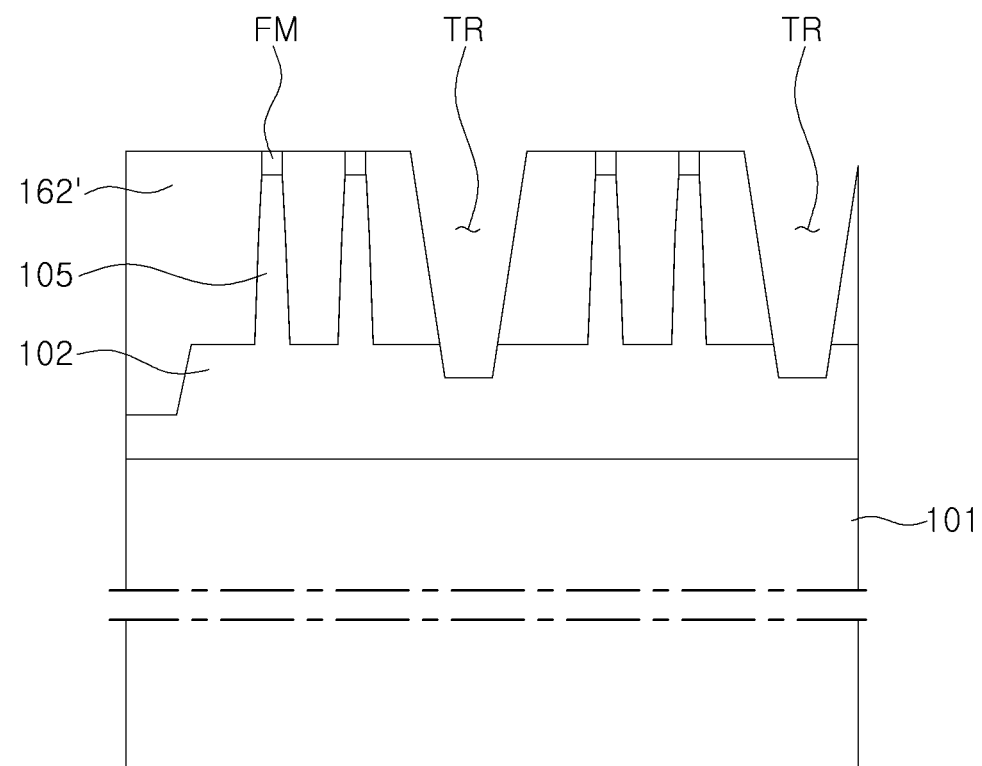

Referring to FIG. 10B, a trench TR may be formed between the plurality of active fins 105.

The trench TR may be formed to extend in a first direction in which the plurality of active fins 105 extend. The formation region of the trench TR may be positioned between the plurality of active fins 105. The trench TR according to this embodiment may be formed to extend through a portion of the active region 102, by penetrating through the first insulating layer 162' (in detail, by penetrating through the device isolation layer 162 in the final structure). The bottom surface of the trench TR may be provided by the active region 102.

Figure 10C:
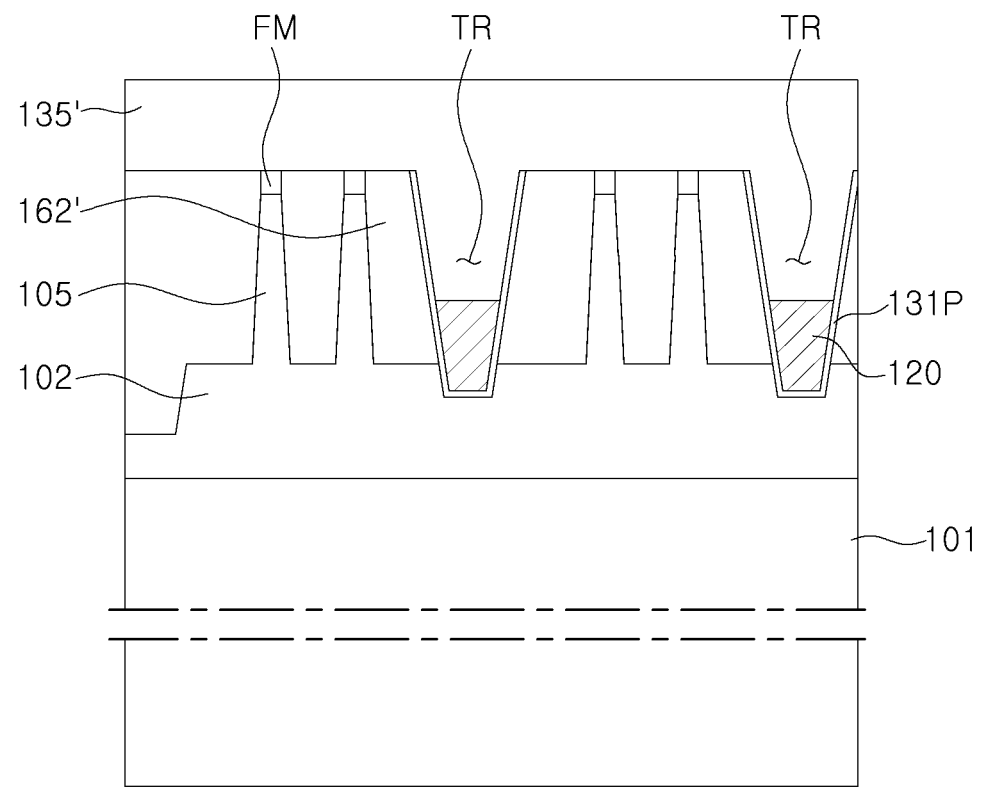

Referring to FIG. 10C, an insulating isolation film 131 and a buried conductive line 120 may be formed in the trench TR, and the buried conductive line 120 may be buried with a second insulating layer 135'.

In this process, a preliminary insulating isolation film 131P for the insulating isolation film 131 may be formed on the upper surface of the first insulating layer 162' and the inner surface of the trench TR, and a process of selectively removing a portion of the preliminary insulating isolation film 131P positioned on the upper surface of the first insulating layer 162' may be performed. Through this process, the preliminary insulating isolation film 131P may be formed on the inner sidewall and bottom surface of the trench TR. Next, after depositing a conductive material on the upper surface of the first insulating layer 162' and within the trench TR, the conductive material portion located on the upper surface of the first insulating layer 162' is removed by applying an etch-back process, and the buried conductive line 120 may be formed by adjusting the height of the conductive material portion in the trench TR. Subsequently, a second insulating layer 135' may be formed such that the buried conductive line 120 may be buried.

Figure 10D:
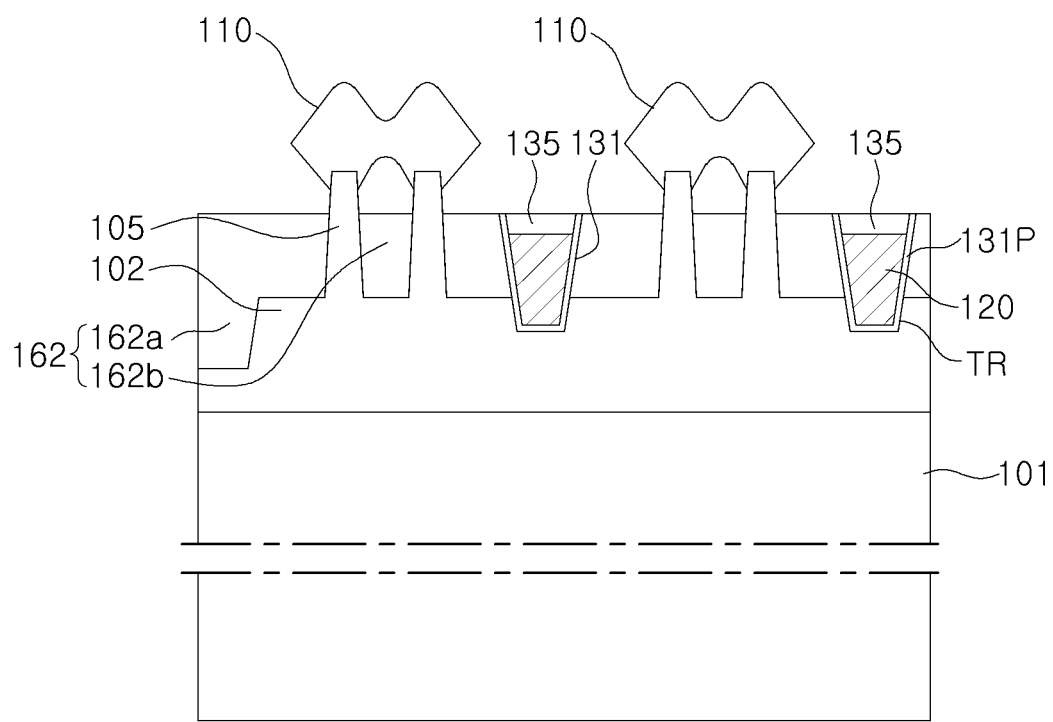

Referring to FIG. 10D, a portion of the active fin 105 is exposed by partially removing the second insulating layer 135' and the first insulating layer 162', and a source/drain region 110 is formed on the exposed portion of the active fin 105.

This process may remove portions of the second insulating layer 135' and the first insulating layer 162' using a planarization process such as CMP. This process may be performed until the fin mask FM is exposed. After removing the fin mask FM, a portion of the plurality of active fins 105 may be exposed by performing an etch-back process so that a portion of the first and second insulating layers 162' and 130' is removed. The first insulating layer 162' obtained by this process may be provided as the device isolation layer 162 of FIG. 3, and the second insulating layer 135' may be provided as the insulating capping layer 135 of FIG. 3. A recess is formed in the exposed portion of the plurality of active fins 105, and selective epitaxial growth is performed on the recess to form the source/drain region 110.

Figure 10E:
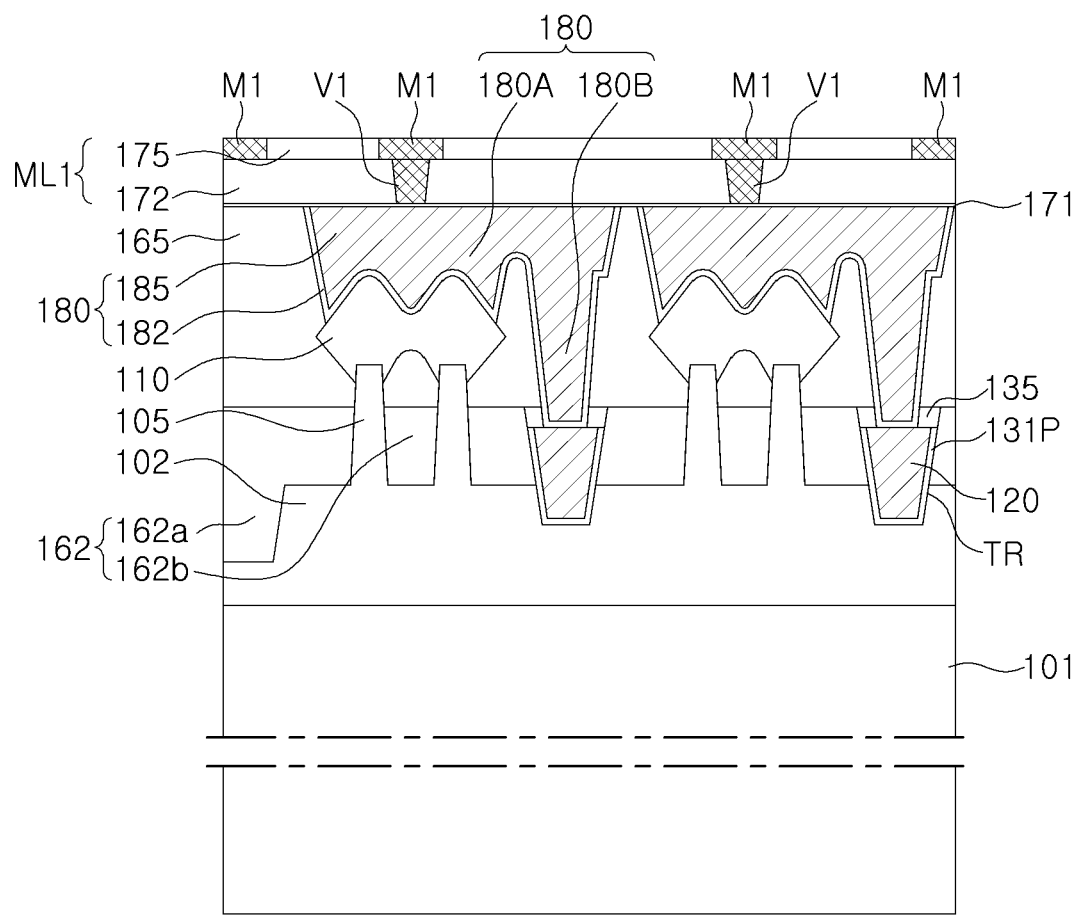

Referring to FIG. 10E, an interlayer insulating layer 165 is formed, a contact structure 180 penetrating through the interlayer insulating layer 165 is formed, and a first wiring portion ML1 is formed on the interlayer insulating layer 165.

The interlayer insulating layer 165 is formed to cover the source/drain region 110, and a contact hole connected to the source/drain region 110 and the buried conductive line 120 is formed in the interlayer insulating layer 165. In this case, the depth of a hole portion connected to the buried conductive line 120 may be greater than the depth of a hole portion connected to the source/drain region 110.

After sequentially forming the conductive barrier 182 and the contact plug 185 so that the contact hole is filled, the upper surface of the contact structure 180 and the upper surface of the interlayer insulating layer 165 may be formed to have a substantially flat coplanar surface by performing a flattening (i.e., planarization) process such as CMP.

Next, a first wiring portion ML1 connected to the contact structure 180 is formed on the interlayer insulating layer 165. The etch stop layer 171 may be formed on the interlayer insulating layer 165, and the first wiring portion ML1 having a plurality of low-dielectric layers 172 and 175, the metal wiring M1, and the metal via V1 may be formed. The metal wiring M1 and the metal via V1 may be formed together using a dual damascene process.

FIGS. 11A to 11D are cross-sectional views of describing a method of manufacturing a semiconductor device illustrated in FIG. 1 (e.g., a process of forming a conductive through-structure and a second wiring portion).

Figure 11A:
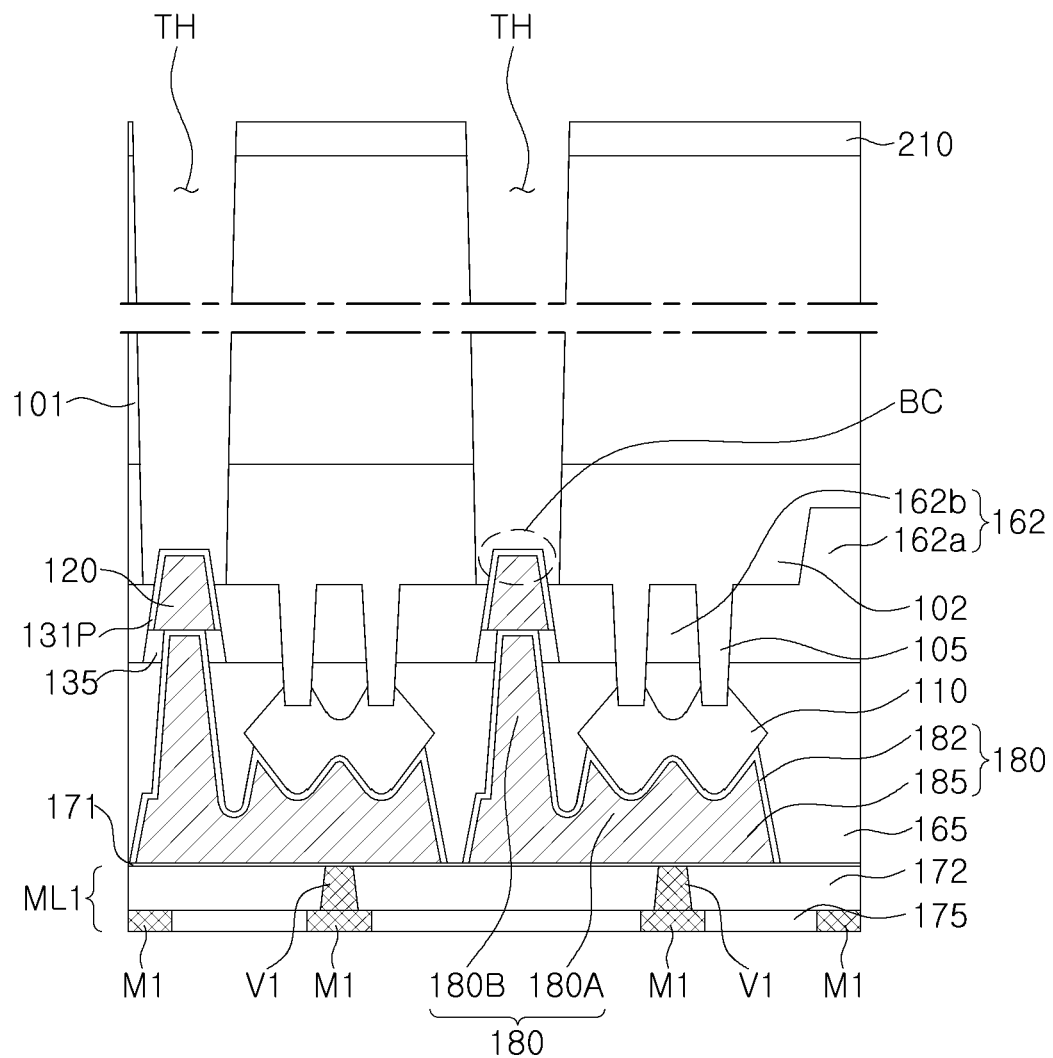
FIGS. 11A to 11D are cross-sectional views of illustrating a method of manufacturing a semiconductor device illustrated in FIG. 1.

Referring to FIG. 11A, after attaching the device manufactured in FIG. 10E to a support, a through-hole TH may be formed in the substrate 101.

The support may be attached to the first wiring portion ML1 of the device manufactured in FIG. 10E to invert the backside of the substrate 101 to face upward. The backside insulating layer 210 for passivation may be formed on the backside of the substrate 101. The through-hole TH may be formed from the backside of the substrate 101 toward the buried conductive line 120. A partial region BC of the buried conductive line 120 may protrude from the bottom surface of the through-hole TH (also referred to as "upper surface" in the description of the previous embodiment). For example, in the through-hole TH, the partial region BC of the buried conductive line 120 may be exposed together with the preliminary insulating isolation film 131P.

Figure 11B:
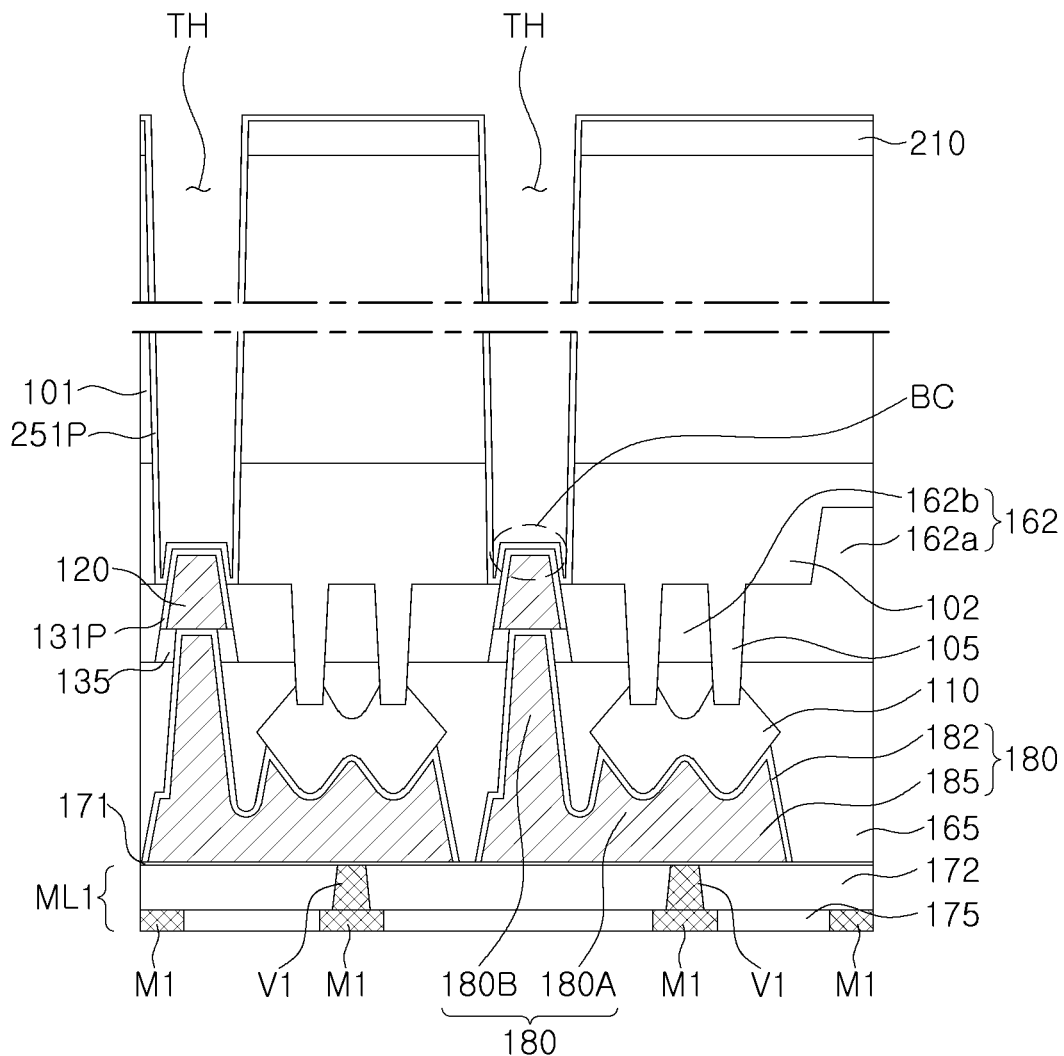

Referring to FIG. 11B, a preliminary insulating liner 251P may be formed on the inner surface of the through-hole TH.

In this process, the preliminary insulating liner 251P may be deposited on the inner sidewall and bottom surface of the through-hole TH. In this deposition process, the preliminary insulating liner 251P may cover the inner sidewall and bottom surface of the through-hole TH, as well as the exposed portion BC of the buried conductive line 120.

Figure 11C:
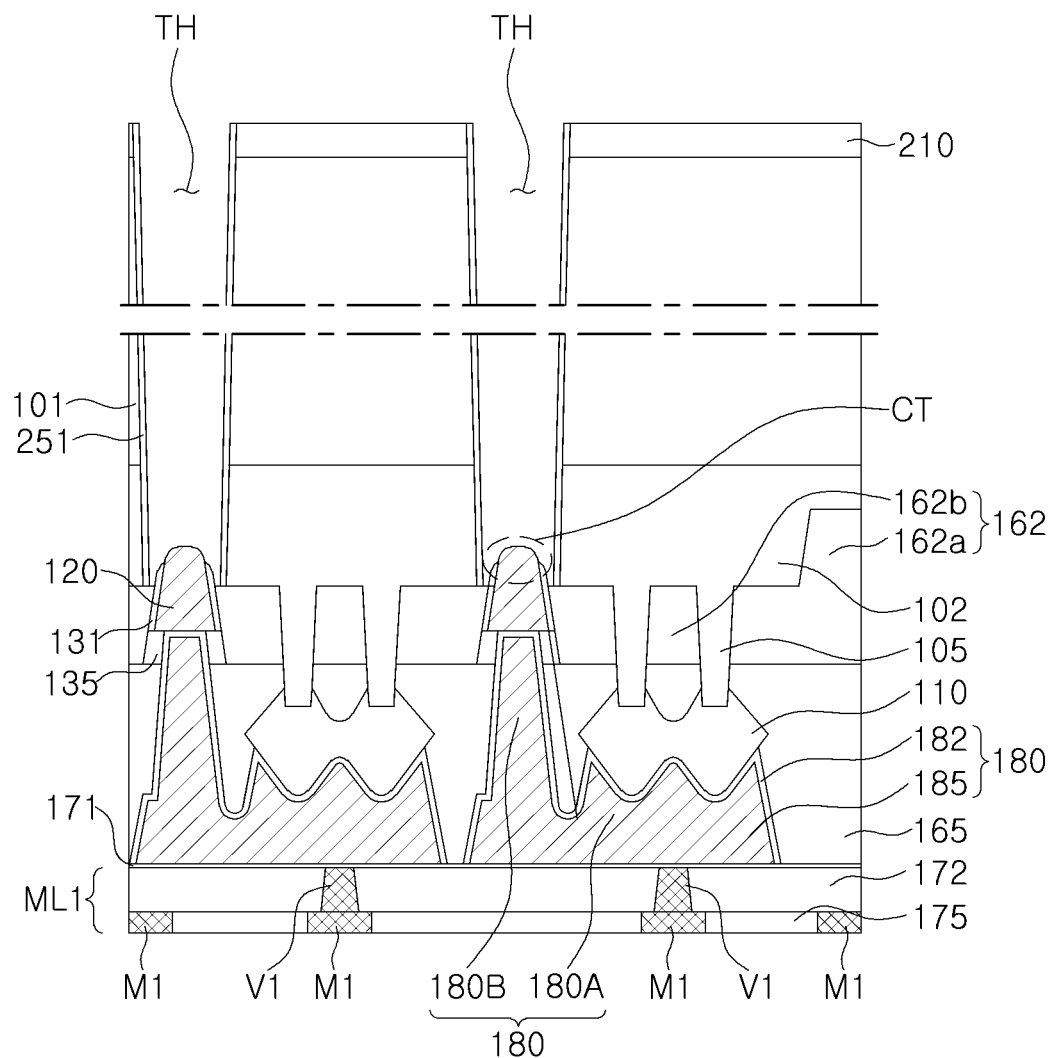

Referring to FIG. 11C, the insulating liner 251 remaining on the inner sidewall of the through-hole TH may be formed by exposing a portion of the preliminary insulating liner 251P located on the bottom surface of the through-hole TH.

This process may be performed by an anisotropic etching process. In this process, portions of the preliminary insulating liner 251P and the preliminary insulating isolation film 131P which are disposed on the exposed portion BC of the buried conductive line 120 are removed together, thereby obtaining the contact region CT with the through-via 255 to be formed in a subsequent process. As described above, since at least a portion of a side surface of the buried conductive line, adjacent to the bottom surface, is also exposed, a contact area CT having a relatively large area may be provided. The insulating liner 251 may be formed by remaining only a portion of the preliminary insulating liner 251P located on the inner sidewall of the through-hole TH.

Figure 11D:
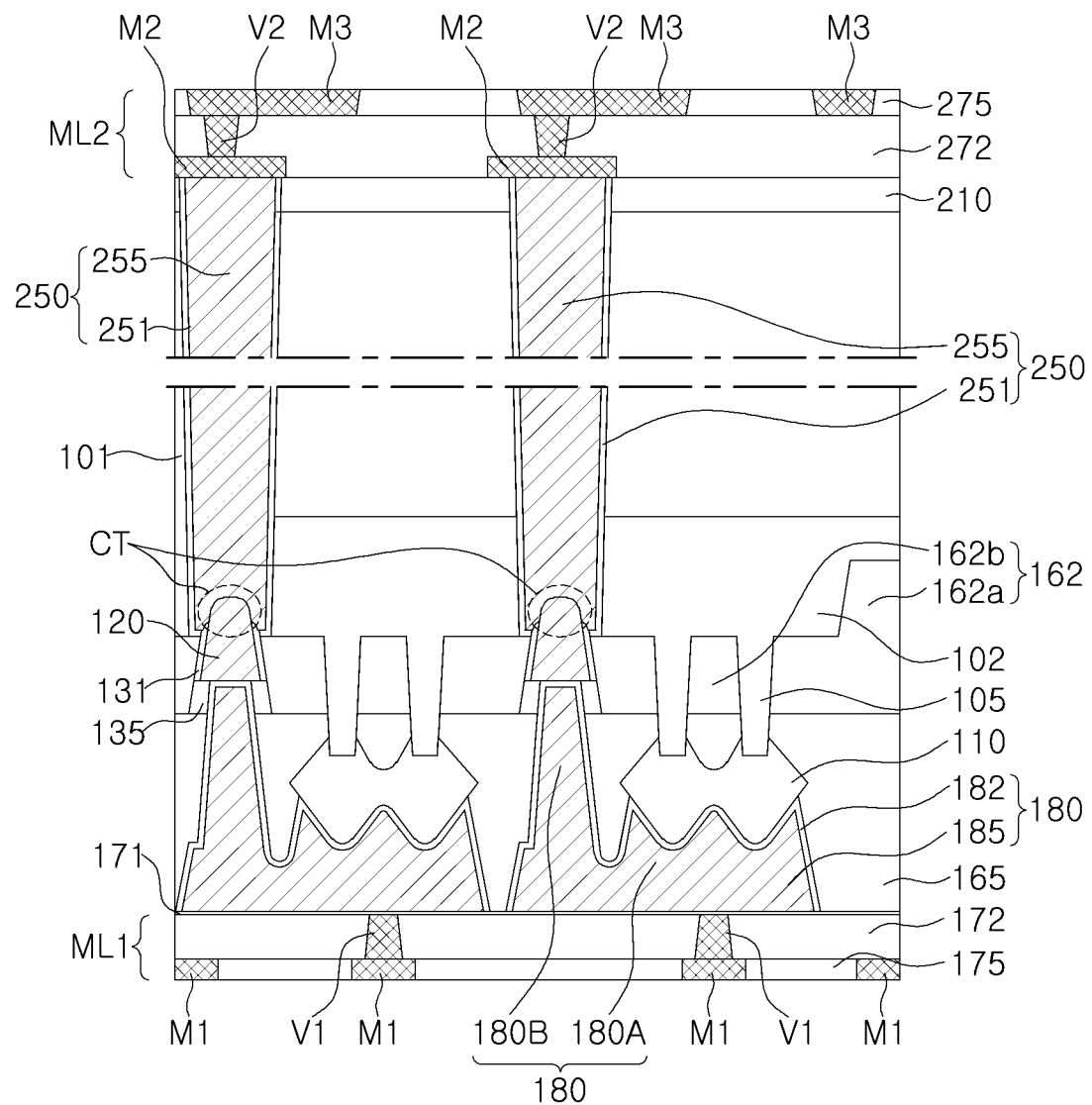

Referring to FIG. 11D, the through-via 255 is formed in the through-hole TH, and a second wiring portion ML2 connected to the conductive through-structure 250 is formed on the backside of the substrate 101.

In this process, the through-via 255 may be formed to fill the through-hole TH to form the conductive through-structure 250 connected to the contact region CT of the buried conductive line 120. In this case, since the through-via 255 contacts not only the bottom surface of the buried conductive line 120, but also a portion of the adjacent side surface, a sufficient contact area may be secured, and as a result, contact resistance may be reduced. In the forming process of the through-via 255, a conductive material is deposited on the backside insulating layer 210 to fill the inside of the through-hole TH, and then, a portion of the conductive material located on the upper surface of the backside insulating layer 210 may be removed by applying a planarization process such as CMP. Through this planarization process, the upper surface of the backside insulating layer 210 and the upper surface of the conductive through-structure 250 may have a substantially flat coplanar surface.

Next, the second wiring portion ML2 may be formed on the backside insulating layer 210. The second wiring portion ML2 may include the plurality of low-dielectric layers 272 and 275, the first and second metal wirings M2 and M3, and the metal vias V2. The first metal wiring M2 is formed to be connected to the conductive through-structure 250, and the second metal wiring M3 and the metal via V2 may be formed using a dual damascene process. The second wiring portion ML2 may provide signal lines and/or power lines for a plurality of devices (e.g., transistors) implemented on the upper surface of the substrate 101 through the buried conductive line 120 and the conductive through-structure 250.

As set forth above, contact resistance may be lowered by increasing the contact area of the conductive through-structure such as a through-silicon via (TSV) and the buried conductive line on the substrate by removing a portion of a preliminary insulating isolation film located on a side surface adjacent to a bottom surface as well as the bottom surface which is exposed to the through-hole of the buried conductive line, and IR drop of a power delivery network may be reduced.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a substrate having a first surface and a second surface opposite each other, and being provided with an active region at the first surface, wherein the active region has a plurality of active fins extending in a first direction;
a first isolation region defining the active region, wherein a bottom surface of the first isolation region is lower than the topmost surface of the first surface of the substrate;
a second isolation region defining the plurality of active fins, wherein a bottom surface of the second isolation region is higher than the bottom surface of the first isolation region;
a buried conductive line buried in the second isolation region, and extending in the first direction;
an insulating isolation film including a first portion which is disposed between the second isolation region and the buried conductive line;
an interlayer insulating layer disposed on the first isolation region and the second isolation region, and covering the buried conductive line;
a contact structure penetrating through the interlayer insulating layer and connected to the buried conductive line;
a through-hole extending toward the first surface of the substrate from the second surface of the substrate, and exposing a portion of the buried conductive line, wherein the exposed portion of the buried conductive line extends beyond the bottom surface of the second isolation region toward the second surface of the substrate;
a through-via disposed in the through-hole and contacting a bottom surface of the exposed portion of the buried conductive line and a side surface of the exposed portion of the buried conductive line, wherein the side surface of the exposed portion of the buried conductive line is adjacent to the bottom surface of the exposed portion of the buried conductive line; and
an insulating liner disposed between an inner sidewall of the through-hole and the through-via.

2. The semiconductor device of claim 1,
wherein the insulating isolation film further includes a second portion that extends beyond the bottom surface of the second isolation region and defines the side surface of the exposed portion of the buried conductive line.

3. The semiconductor device of claim 2,
wherein the second portion of the insulating isolation film has a thickness smaller than a thickness of the first portion of the insulating isolation film.

4. The semiconductor device of claim 2,
wherein the second portion of the insulating isolation film has an increasing thickness toward the second isolation region.

5. The semiconductor device of claim 2,
wherein the side surface of the exposed portion of the buried conductive line is entirely in contact with the through-via, and
wherein the exposed portion of the buried conductive line is not covered by the second portion of the insulating isolation film.

6. The semiconductor device of claim 1,
wherein the bottom surface of the exposed portion of the buried conductive line has a rounded edge.

7. The semiconductor device of claim 1,
wherein the through-hole extends from the second surface of the substrate to the second isolation region to expose a portion of the bottom surface of the second isolation region, and
wherein the through-via further contacts the exposed portion of the bottom surface of the second isolation region.

8. The semiconductor device of claim 1,
wherein the through-via has an upper end that is spaced apart from an upper surface of the active region and is lower than the upper surface of the active region,
wherein a portion of the active region is interposed between the upper end of the through-hole and the bottom surface of the second isolation region, and
wherein the insulating liner is interposed between the portion of the active region and the through-via to electrically insulate the active region from the through-via.

9. The semiconductor device of claim 1,
wherein in a cross-section taken in a second direction intersecting the first direction, a central axis of the buried conductive line is offset from a central axis of the through-via.

10. The semiconductor device of claim 9,
wherein the side surface of the exposed portion of the buried conductive line has a first side and a second side opposite each other,
wherein the first side of the buried conductive line is in contact with the through-via, and
wherein the second side of the buried conductive line is electrically insulated from the active region by the insulating isolation film.

11. The semiconductor device of claim 1,
wherein in a cross section taken in a second direction intersecting the first direction, a first width of an upper surface of the through-hole is greater than a second width of an upper surface of the buried conductive line, and
wherein the first width and the second width are measured in the second direction.

12. The semiconductor device of claim 1,
wherein a height of the buried conductive line ranges from 30 nm to 200 nm, and
wherein a height of a side portion of the buried conductive line contacting the through-via is at least 3 nm.

13. The semiconductor device of claim 1,
wherein the buried conductive line has an upper surface that is higher than an upper surface of the active region and is lower than an upper end of the plurality of active fins.

14. The semiconductor device of claim 1, further comprising:
a source/drain disposed on the plurality of active fins,
wherein the contact structure is connected to the source/drain.

15. The semiconductor device of claim 1, further comprising:
a first wiring disposed on the interlayer insulating layer and electrically connected to the contact structure; and
a second wiring disposed on the second surface of the substrate and connected to the through-via.

16. A semiconductor device comprising:
a substrate having a first surface and a second surface opposite the first surface, and being provided with an active region at the first surface;
a buried conductive line disposed in the active region and extending in a first direction, wherein the buried conductive line has a first portion and a second portion, and the second portion of the buried conductive line is surrounded by the active region;
an insulating layer disposed on the first surface of the substrate and covering the buried conductive line, wherein the first portion of the buried conductive line is buried in the insulating layer;
a contact structure disposed on the insulating layer and connected to the buried conductive line;
a through-hole extending from the second surface of the substrate to the insulating layer and exposing the second portion of the buried conductive line;
an insulating isolation film disposed on a side surface of the buried conductive line and surrounding the buried conductive line, the insulating isolation film exposing a bottom surface of the second portion of the buried conductive line and a side surface of the second portion of the buried conductive line, wherein the side surface of the second portion of the buried conductive line is adjacent to the bottom surface of the second portion of the buried conductive line;
a through-via disposed in the through-hole and contacting the bottom surface of the second portion of the buried conductive line and the side surface of the second portion of the buried conductive line;
an insulating liner disposed between an inner side wall of the through-hole and the through-via; and
a backside wiring disposed on the second surface of the substrate and connected to the through-via.

17. The semiconductor device of claim 16,
wherein the through-via is in contact with a portion of a bottom surface of the insulating layer exposed by the through-hole.

18. The semiconductor device of claim 16,
wherein the insulating isolation film has a portion extending beyond a bottom surface of the insulating layer toward the second surface of the substrate, and
wherein the extended portion of the insulating isolation film has an increasing thickness toward the bottom surface of the insulating layer.

19. A semiconductor device comprising:
a substrate having a first surface and a second surface opposite the first surface, and being provided with an active region at the first surface;
a through-via extending from the second surface of the substrate toward the first surface thereof;
an insulating layer disposed on the first surface of the substrate;
a buried conductive line buried in the insulating layer and the through-via, and extending in a first direction;
a contact structure disposed on the insulating layer and connected to the buried conductive line;
an insulating isolation film disposed on a side surface of the buried conductive line and surrounding the buried conductive line, the insulating isolation film exposing a bottom surface of the buried conductive line and a side surface of the buried conductive line, wherein the side surface of the buried conductive line is adjacent to the bottom surface thereof;
an insulating liner disposed on a side surface of the through-via and configured to insulate the through-via from the active region of the substrate; and
a backside wiring disposed on the second surface of the substrate and connected to the through-via.

20. The semiconductor device of claim 19,
wherein the insulating liner includes a first portion extending from the second surface of the substrate toward the bottom surface of the insulating layer and a second portion connecting the first portion of the insulating liner to the insulating isolation film surrounding the buried conductive line, and
wherein the first portion of the insulating liner and the second portion of the insulating liner have different thicknesses.

\* \* \* \* \*